US007353440B2

(12) United States Patent
Ohwada et al.

(10) Patent No.: US 7,353,440 B2
(45) Date of Patent: Apr. 1, 2008

(54) MULTICORE PROCESSOR TEST METHOD

(75) Inventors: Akihiko Ohwada, Saitama (JP); Tatsumi Nakada, Kawasaki (JP); Hitoshi Yamanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 493 days.

(21) Appl. No.: 10/967,280

(22) Filed: Oct. 19, 2004

(65) Prior Publication Data

US 2005/0240850 A1    Oct. 27, 2005

(30) Foreign Application Priority Data

Apr. 22, 2004  (JP) .............................. 2004-127216

(51) Int. Cl.
*G01R 31/28* (2006.01)
(52) U.S. Cl. ..................................... 714/726
(58) Field of Classification Search ................. 714/726
See application file for complete search history.

(56) References Cited

U.S. PATENT DOCUMENTS 6,249,893 B1 * 6/2001 Rajsuman et al. .......... 714/741

| | | | |
|---|---|---|---|
| 6,954,886 B2 * | 10/2005 | Tu et al. ....................... | 714/726 |
| 7,139,947 B2 * | 11/2006 | Miner et al. ................. | 714/726 |
| 2004/0006729 A1 * | 1/2004 | Pendurkar .................... | 714/733 |

* cited by examiner

*Primary Examiner*—James C. Kerveros
(74) *Attorney, Agent, or Firm*—Bingham McCutchen LLP

(57) ABSTRACT

In processors having multiple cores, such as CMPs, an independent MISR test pattern compression circuit is provided for each logic block, which makes it possible to perform LSI tests more efficiently. A processor includes a plurality of logic block circuits, which include at least a first processor core circuit and a second processor core circuit, each processor core circuit having a scan chain circuit and being operable independently, and a common block circuit having a scan chain circuit and a cache circuit that is shared by the first processor core circuits and the second processor core circuits. The processor further includes, for each logic block, a test pattern generating circuit operable to generate a test pattern and input the test pattern to the scan chain of each logic block circuit, and a test pattern compression circuit operable to accept as input and compress the test pattern output by the scan chain of each logic block circuit.

30 Claims, 14 Drawing Sheets

MULTICORE PROCESSOR TEST METHOD

CROSS REFERENCE TO RELATED APPLICATION

This application is related to and claims priority to Japanese Application No. 2004-127216 filed Apr. 22, 2004 in the Japanese Patent Office, the contents of which are incorporated by reference herein.

BACKGROUND OF THE INVENTION

1. Field of the Invention

The present invention relates to processors such as a CPU (Central Processing Unit), MPU (Micro Processing Unit), DSP (Digital Signal Processor) or GPU (Graphics Processing Unit: graphics processor, or image processing LSI or geometry engine), comprising a plurality of execution units (hereinafter referred to simply as "cores"), and to testing methods for such processors.

2. Description of the Related Art

Conventionally, in computer systems, such as servers, where especially high processing capacity is required, such as for the primary business processing of an enterprise, improvements in processing capacity have been achieved by connecting a plurality of processors via loose coupling using a cluster configuration or close coupling using an SMP (Symmetrical Multi-Processor) configuration.

However, with loose coupling using a cluster configuration, communication overhead between the server nodes becomes a problem, while in the case of close coupling using SMP, complexity of the server hardware becomes a problem, and in both cases, with conventional architecture, there is a limit to the performance improvement that could be achieved on a single computer system.

In this regard, multicore processors such as CMPs (Chip Multi-Processors), which enable performance improvements by employing a multicore architecture wherein a plurality of cores are installed in a single processor, are currently becoming mainstream in the field of high-end processors.

However, in the case of multicore configurations such as CMP, contrary to the improvements in processing performance achieved by increasing the number of cores, there are problems such as increasing complexity of control due to installation of a plurality of cores and lower yields during semiconductor manufacturing due to increased die size. The reduced yields during semiconductor manufacturing due to the increased die size are a particularly important problem for multicore processors such as CMPs comprising a multicore.

FIG. 1 illustrates the basic hardware configuration of a conventional single-core processor.

Processor 101 comprises a unified level-2 cache block 102 comprising a local interconnect interface 110 and a unified level-2 cache 111, and a core block 103 comprising a level-1 instruction cache 112, level-1 data cache 113, instruction branch unit 114, instruction issue unit 115, load store unit 116, general purpose register file 117, integer execution unit 118, integer completion unit 119, floating point register file 120, floating point execution unit 121, and floating point completion unit 122. The processor 101 is connected to other processors and to main memory via the local interconnect interface 110 and receives instructions and data from the main memory.

An instruction received through the local interconnect interface 110 is fed via the unified level-2 cache 111, level-1 instruction cache 112 and instruction branch unit 114 into either the general purpose register file 117 or the floating point register file 120, and is given to either the integer execution unit 118 or the floating point execution unit 120.

Data received through the local interconnect interface 110 is fed via the unified level-2 cache 111, level-1 data cache 113 and load store unit 116 into either the general purpose register file 117 or floating point register file 120, thereby providing data to either the integer execution unit 118 or the floating point execution unit 121.

The data to be operated on in said integer execution unit 118 and the result of the operation in the integer execution unit 118 are written back and stored in the general-purpose register file 117 by the integer completion unit 119. The data to be operated on in the floating point execution unit 121 and the result of the operation in the floating point execution unit 121 are written back and stored in the floating point register file 120 by the floating point completion unit 122.

Thus, one method to improve processing performance of a computer system, such as a server, is to increase the number of execution units contained in the computer system.

Furthermore, the configuration of a server using a conventional symmetrical multiprocessor is shown in FIG. 2. Processor 201 comprises a single core block 211 and level-2 cache block 210. Furthermore, the server system comprises a plurality of said processors 201 connected via a processor local interconnect, a service processor 203 connected via a JTAG interface as specified in IEEE 1149.1, and a processor local interconnect arbiter 202, as well as a system backplane crossbar controller 206 connected via a system backplane crossbar. The processor local interconnect arbiter 202 performs arbitration between the processors connected to the processor local interconnect. Moreover, the system backplane crossbar controller 206 performs interface control among system boards connected to the system backplane crossbar.

The registers and scan FFs in each CPU are set by performing scans on the core blocks 211 in said plurality of processors 201 via the JTAG interface by controlling the service processor 203 by means of a service processor program 204 and a service processor terminal 205.

Next, as an example of the application of multicore processors, FIG. 3 illustrates the configuration of a server system using 2-CMP multicore processors with two cores. Processor 301 comprises a core-0 block 311, core-1 block 312 and CMP common block 310. Furthermore, the server system comprises a plurality of said processors 301 connected via a processor local interconnect, a service processor 203 connected via a JTAG interface and a processor local interconnect arbiter 202, as well as a system backplane crossbar controller 206 connected via a system backplane crossbar. The registers and scan FFs in each CPU are set by performing scans on the core-0 block 311 and core-1 block 312 in said plurality of processors 301 via the JTAG interface by controlling the service processor 203 by means of a service processor program 204 and a service processor terminal 205.

System configurations containing a JTAG interface were described above for the case where processors are installed in a computer system such as server. However, another important function of the JTAG interface is LSI component testing during semiconductor manufacture. Conventionally, in LSI component testing, identification of defect-free LSIs was performed by inputting a test pattern from an LSI tester into the LSI to be tested, testing the LSI internal circuitry, and then returning the output to the LSI tester and comparing it to expected value data that had been prepared in advance.

However, with the increasing scale of LSI logic, such as processors manufactured to a high scale of integration by recent ultramicro processes, it has become impossible to disregard the scale of the test pattern size. Increased test pattern size not only affects production efficiency by requiring a longer time for LSI component testing, but also requires more advanced and high performance LSI testers, leading to increased costs of LSI testing.

In this regard, in recent processors and other large scale integrated circuits, the method has been adopted whereby a self-diagnosis circuit called a BIST (Built-In Self Test) circuit, comprising a test pattern generating circuit and a test result analyzer circuit, is incorporated in advance, thereby greatly reducing the signal interface between the LSI circuit being tested and the LSI tester and keeping the costs of the LSI test from increasing. BIST circuits designed for logic circuits are broadly categorized as RAM-BIST, which is used for testing memory, especially built-in caches, in a large-scale integrated circuit such as a processor, and logic BIST, which is used for testing logic, such as built-in execution units. Since logic BISTs are designed for testing logic circuits such as execution units, as described above, in multicore processors which are currently becoming mainstream, a logic BIST circuit which treats the plurality of built-in cores as a test unit could be installed.

Here, FIG. 4 illustrates an example of the conventional configuration of a logic BIST circuit in a 2-CMP multicore processor comprising two core blocks. Processor 401 is a 2-CMP multicore processor comprising a logic BIST circuit 402, core-0 block 403, core-1 block 404, and CMP common block 405. Furthermore, logic BIST circuit block 402 contains a TAP controller 411, scan chain selection control circuit 412, LFSR (Linear Feedback Shift Register) test pattern, generating circuit 413, scan chain switching MUX circuit 414, and MISR test pattern compression circuit 415.

The TAP (Test Access Port) controller 411 controls scan shifting for circuits such as built-in RAM and built-in execution units at the wafer manufacturing stage and package manufacturing stage in the LSI manufacturing process of the processor 401. Furthermore, when a processor 401 equipped with said TAP controller 411 is installed in a computer system, system control is performed by means of JTAG commands and the like.

First, the scan chain selection control circuit 412 is controlled by the TAP controller 411 and the scan chain is switched by means of the scan chain switching MUX circuit 414 from system mode to logic BIST mode (scan chain select).

Then, an initial test pattern is transferred from the LSI tester (not illustrated) to the TAP controller 411 (test data-in). Next, the TAP controller 411 causes the initial test pattern to be scanned into test pattern storage shift register included inside the LFSR test pattern generating circuit 413 (test pattern scan-in), and applies a shift clock (not illustrated) to said shift register, causing a pseudo-random number based test pattern to be generated as the output of the LFSR test pattern generating circuit 413. Working each logic block circuit by applying a pulse of the system clock, resulting in setting the logically operated test patterns by the logic block circuit to the scan chains of each logic block circuit, the generated test pattern passes through the scan chain switching MUX circuit 414 that is switched to logic BIST mode, and said generated test pattern is applied to core-0 block internal scan F/F chain 421, core-1 block internal scan F/F chain 422, and CMP common block internal scan F/F chain 423.

Furthermore, each test pattern that has passed through the core-0 block internal scan F/F chain 421, core-1 block internal scan F/F chain 422, and CMP common block internal scan F/F chain 423 is inputted into the MISR test pattern compression circuit 415.

The MISR test pattern compression circuit 415 furthermore scans seed data into the shift register for storing signatures that are included within the MISR test pattern compression circuit 415 (seed scan-in), and a shift clock (not illustrated) from said TAP controller 411 is applied, causing said test pattern to be compressed into a signature (nth order bit sequence data), which is outputted to the TAP controller 411 (signature scan-out).

The signature of the core-0 block 403, core-1 block 404 and CMP common block 405 inputted into the TAP controller 411 from said MISR test pattern compression circuit 415 is transferred from the TAP controller 411 to the LSI tester (not illustrated) (test data-out) and is compared in the LSI test to the respective expected value data to analyze the LSI test results. Namely, if the inputted signature of the logic block matches the corresponding expected value data, the test analysis result for that logic block will be 'pass,' and if it does not match, the test analysis result for that logic block will be 'fail.'

The test pattern generation operation in the LFSR test pattern generating circuit 413 and the test pattern compression operation in the MISR test pattern compression circuit 415 are described below with the aid of FIG. 11 and FIG. 12 respectively.

In the present conventional configuration, since the test patterns that have passed through the core-0 block 403, core-1 block 404 and CMP common block 405 respectively are inputted into the same MISR test pattern compression circuit 415, there is a single compressed test pattern for the entire LSI circuit, and a single expected value datum that is compared to that compressed test pattern in the LSI tester for the entire LSI circuit.

Therefore, if the LSI circuit in question is an LSI circuit that contains a plurality of logic blocks, such as multicore processor, as shown in the conventional configuration disclosed in FIG. 4, then all the test patterns that have passed through all the logic blocks, i.e. through core-0 block 403, core-1 block 404 and CMP common block 405, will be joined together and compressed into a single signature, thus making it difficult to analyze the test results individually each logic block (the core-0 block 403, core-1 block 404 and CMP common block 405) based on comparison of the single signature against the corresponding expected value data.

Furthermore, even assuming it were possible to analyze the test results for each individual logic block based on said single signature, there was still the problem that identification of a defect-free LSI is not possible unless the comparison of all the logic blocks against the expected value data is completed. Namely, for multicore processors comprising a plurality of cores, there was the problem that the testing costs for completely defect-free LSI test result analysis were the same as for partial core defect-free test result analysis.

Japanese Unexamined Patent Application Publication 2001-74811 discloses the art of building a BIST circuit comprising an LFSR pattern generating circuit and an MISR pattern compression circuit for each circuit module into a semiconductor integrated circuit comprising a plurality of circuit modules, and thereby executing self-tests at the circuit module level. In the BIST circuit comprising an LFSR pattern generating circuit and MISR pattern compression circuit, installed for each circuit module, as illustrated in FIG. 1 and FIG. 10 of Japanese Unexamined Patent Application Publication 2001-74811, the scale of the BIST circuit is reduced at the point of the circuit configuration that connects and isolates the test path between circuit modules.

However, in the configuration disclosed in FIG. 1 of said Japanese Unexamined Patent Application Publication 2001-74811, the BIST circuits of each of the circuit modules are connected in series, while in the configuration disclosed in FIG. 10 of the Japanese Unexamined Patent Application Publication 2001-74811, the scan paths of the circuit modules are not isolated, and thus, for example, when analyzing the results of the MISR pattern compression circuit connect only to the circuit modules required for identification of a partially defect-free LSI, if all the circuit modules other than the circuit modules for which results are to be analyzed are defective, then the scan path of the whole LSI will not function normally, and thus the MISR pattern compression circuit will also not function normally, making it altogether impossible to implement partially defect-free LSI identification.

In the prior art, as described above, in a processor with a multicore configuration based on CMP or the like, reduced yield due to increased die size was a problem. In this connection, noting the fact that a processor with a multicore configuration comprises a plurality of core blocks and a single CMP common block, a method could be considered whereby a processor could be salvaged as a partially defect-free LSI if one or more core blocks and the CMP common block were functioning normally. This method would mean that an LSI that was not fully defect-free could be salvaged as a partially defect-free LSI with a configuration capable of functioning as a processor and thus could be marketed for use as a single processor for entry-level models or the like. Namely, productizing partially defect-free LSIs that conventionally would have been disposed of would make it possible to provide differentiation in terms of performance and cost within a lineup having the same processor architecture. However, in the prior art, identifying a partially defect-free LSI at the time of manufacturing required collection and analysis of scan data for all scan points, etc., just as for completely defect-free LSIs, so the analysis was complicated and the LSI test was costly and time-consuming.

SUMMARY OF THE INVENTION

The present invention advantageously simplifies and accelerates identification of not only completely defect-free LSIs but also partially defect-free LSIs, and improves yield and reduces costs by salvaging partially core defect-free LSIs during semiconductor manufacture, which is to be achieved in that, in order to more efficiently identify completely defect-free LSI/partially defect-free LSI/defective LSI in an LSI test for processors having a multicore, such as CMPs, out of the LFSR (Linear Feedback Shift Register) based test pattern generating circuit and the MISR (Multiple Input Signature Register) based test pattern compression circuit which make up logic BIST circuits that are installed in processors, a MISR test pattern compression circuit that performs test pattern compression in the LSI test is to be provided independently for each core block and for the CMP common block.

In one embodiment, the present invention comprises a plurality of logic block circuits, said plurality of logic block circuits comprising at least a first processor core circuit and a second processor core circuit, each processor core circuit having a scan chain circuit and being operable independently, and a common block circuit having a scan chain circuit and a cache circuit that is shared by the first processor core circuits and the second processor core circuits, the processor further comprising, for each the logic block, a test pattern generating circuit operable to generate a test pattern and input the test pattern to the scan chain of each logic block circuit, and a test pattern compression circuit operable to accept as input and compress the test pattern output by the scan chain of each logic block circuit.

The processor further comprises a TAP controller circuit, and said pattern generating circuits comprises a shift register circuit, wherein the TAP controller circuit is operable to set an initial value in the shift register circuit, apply a shift clock causing the pattern generating circuit to generate a test pattern for testing each logic block circuit in the shift register circuit, and working each logic block circuit by applying a pulse of the system clock, resulting in setting the logically operated test patterns by the logic block circuit to the scan chains of each logic block circuit, and inputting the logically operated test patterns output by the scan chains of each logic block circuit The processor further comprises a TAP controller circuit, and the pattern compression circuit comprises a shift register circuit, wherein the pattern compression circuit is operable to accepts as input a test pattern output by a scan chain of each logic block, and the TAP controller circuit applies a shift clock causing said pattern compression circuits to compress the pattern in shift register circuits.

The processor further comprises, for each logic block circuit, a test analyzer circuit connected to the test pattern compression circuit, and each test analyzer circuit is operable to output test analysis results for a corresponding logic block circuit.

The test analyzer circuit comprises a first storing circuit operable to store a signature that constitutes results of compression by the test pattern compression circuit, a second storing circuit operable to store expected value data for the signature, and a comparator circuit operable to output test analysis results for given logic block circuits by comparing the signature and expected value data for the signature.

The processor comprises, for each logic block, an I/O pad connected to an output of the test pattern compression circuit of each logic block circuit.

The processor comprises, for each logic block, an I/O pad connected to an output of test analyzer circuit of each logic block circuit.

In one embodiment, the present invention comprises a plurality of logic block circuits, plurality of logic block circuits comprising at least a first through nth processor core circuits, each processor core circuit having a scan chain circuit and being operable independently, and a common block circuit having a scan chain and a cache circuit that is shared by the first through nth processor core circuits, the processor further comprising, for each logic block, a test pattern generating circuit operable to generate a test pattern and input the test pattern to of each logic block circuit, and a test pattern compression circuit operable to accept as input and compress the test pattern output by the scan chain of each logic block circuit.

In one embodiment, the present invention comprises a testing method for a processor comprising a plurality of logic block circuits, plurality of logic block circuits comprising at least a first processor core circuit and a second processor core circuit, each processor core circuit having a scan chain circuit and being operable independently, and a common block circuit having a scan chain circuit and a cache circuit that is shared by the first processor core circuits and the second processor core circuits, the processor further comprising, for each logic block, a test pattern generating circuit operable to generate a test pattern and input the test pattern to the scan chain of each logic block circuit, and a test pattern compression circuit operable, to accept as input and compress the logically operated test pattern output by the scan chain of each logic block circuit, the testing method comprising generating a test pattern with each test pattern generating circuit, inputting the generated test patterns from each test pattern generating circuit into the scan chains of each logic block circuit, and working each logic block circuit by applying a pulse of the system clock, resulting in setting the logically operated test patterns by the logic block circuit to the scan chains of each logic block circuit, and inputting the logically operated test patterns output by the scan chains of each logic block circuit into the test pattern compression circuits and compressing the input test patterns.

Wherein in the processor testing method, the processor comprises a TAP controller circuit, the pattern generating circuit comprises a shift register circuit, and the test patterns are generated by the TAP controller circuit setting an initial value in the shift register circuit, and applying a shift clock outputted by said TAP controller, causing the test pattern to be generated in said shift register circuit.

Wherein in the processor testing method, the processor comprises a TAP controller circuit and the pattern compression circuit comprises a shift register circuit; and the test patterns are compressed by accepting the test pattern outputted by the scan chains of each logic block as input and applying a shift clock by said TAP controller circuit, causing the test pattern to be compressed in the shift register circuit.

Wherein in the processor testing method, the processor comprises a test analyzer circuit connected to the test pattern compression circuit for each logic block circuit; and the processor testing method further comprises after compressing the test patterns, outputting from the test analyzer circuit the test analysis results for the respective logic block circuit.

Wherein in the processor testing method, the processor comprises, for each logic block, an I/O pad which connects the output of the test analyzer circuit provided for each logic block circuit, and after the test analysis results for the logic block circuit are outputted, outputting the test analysis result for the given logic block circuit, which is the output of the test analyzer circuit, through said I/O pad.

Wherein in the processor testing method, the test analyzer circuit comprises a first storing circuit which stores the signature that constitutes the results of compression by the test pattern compression circuit, a second storing circuit which stores the expected value data for the signature, and a comparator circuit which outputs the test analysis results for the given logic block circuit by comparing the signature and the expect value data for the signature, and wherein the test analysis results for the logic block circuit are outputted by storing the signature in the first storing circuit, storing the expected value data for the signature in the second storing circuit, and comparing in the comparator circuit the signature to the expected value data for said signature.

Wherein in the processor testing method, the processor comprises, for each logic block, an I/O pad which connects the output of the test analyzer circuit provided for each logic block circuit, and after the test analysis results for the logic block circuit are outputted, outputting the test analysis result for the given logic block circuit, which is the output of said test analyzer circuit, through the I/O pad.

Wherein in the processor testing method, the processor comprises, for each logic block, an I/O pad which connects the output of the test pattern compression circuit provided for each logic block circuit, and after the step wherein the test patterns are compressed, the testing method comprises outputting the signature constituting the compression results of the test pattern compression circuit through the I/O pad.

In one embodiment, the present invention comprises a plurality of logic block circuits, plurality of logic block circuits comprising at least a first through nth processor core circuits, each processor core circuit having a scan chain circuit and being operable independently, and a common block circuit having a scan chain and a cache circuit that is shared by the first through nth processor core circuits, the processor further comprising, for each logic block, a test pattern generating circuit operable to generate a test pattern and input the test pattern to of each logic block circuit, and a test pattern compression circuit operable to accept as input and compress the logically operated test pattern output by the scan chain of each logic block circuit, the testing method comprising generating a test pattern with each test pattern generating circuit, inputting generated test patterns from each test pattern generating circuit into the scan chains of each logic block circuit, and working each logic block circuit by applying a pulse of the system clock, resulting in setting the logically operated test patterns by the logic block circuit to the scan chains of each logic block circuit, and inputting the logically operated test patterns output by the scan chains of each logic block circuit into test pattern compression circuits and compressing the input test patterns.

According to the present invention, as described above, providing an independent MISR test pattern compression circuit for each logic block in a multicore processor such as a CMP comprising a plurality of processor cores makes it possible to perform LSI tests more efficiently.

BRIEF DESCRIPTION OF THE DRAWINGS

The preferred embodiments of the present invention will be described with reference to the accompanying drawings.

DETAILED DESCRIPTION OF THE PREFERRED EMBODIMENTS

A first through sixth modes of embodiment of the present invention are described in detail below with reference to the drawings.

Figure 1:
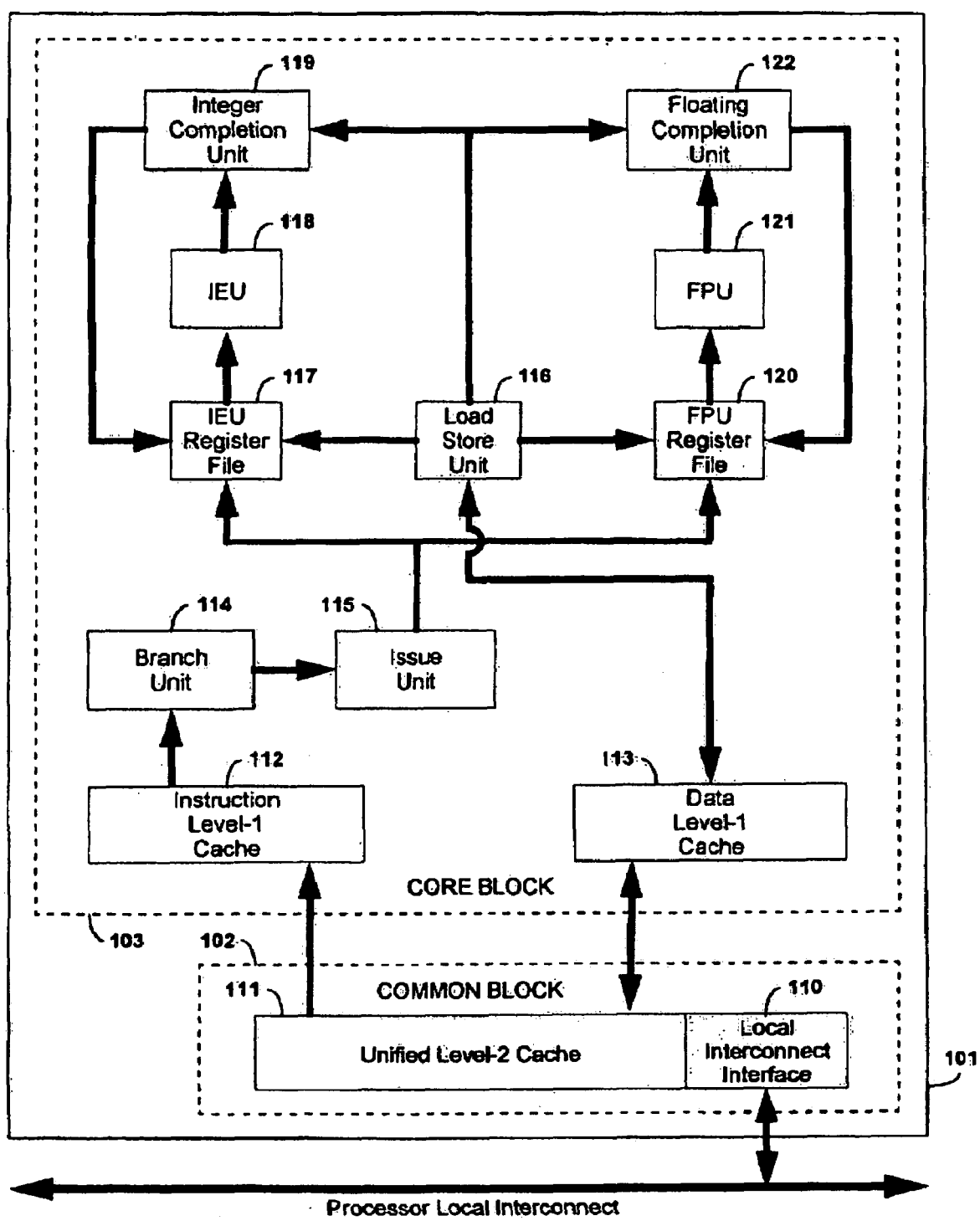
FIG. 1 is a drawing illustrating the basic hardware configuration of a processor.
Figure 2:
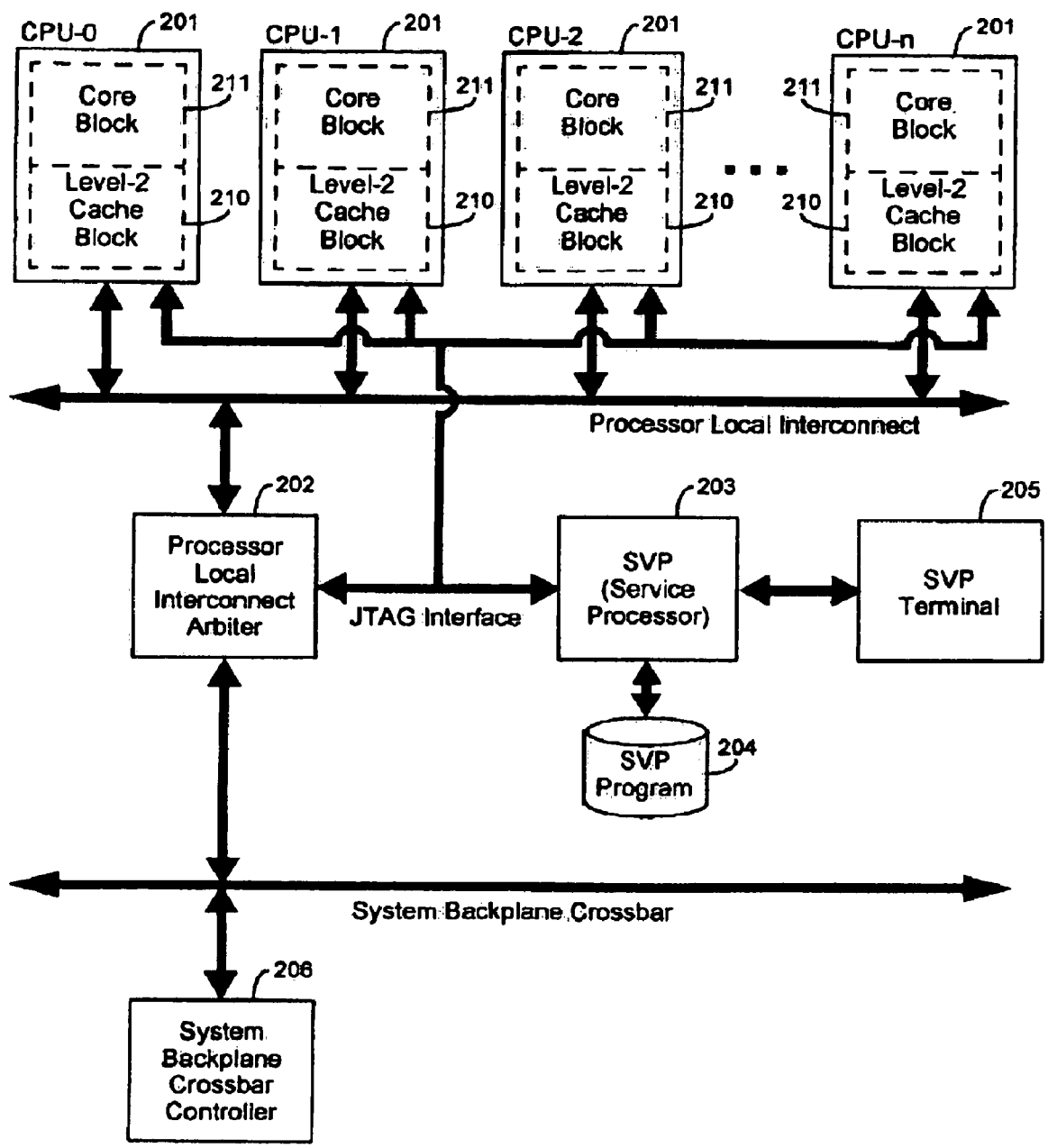
FIG. 2 is a drawing illustrating the configuration of a server system using a conventional symmetrical multiprocessor.
Figure 3:
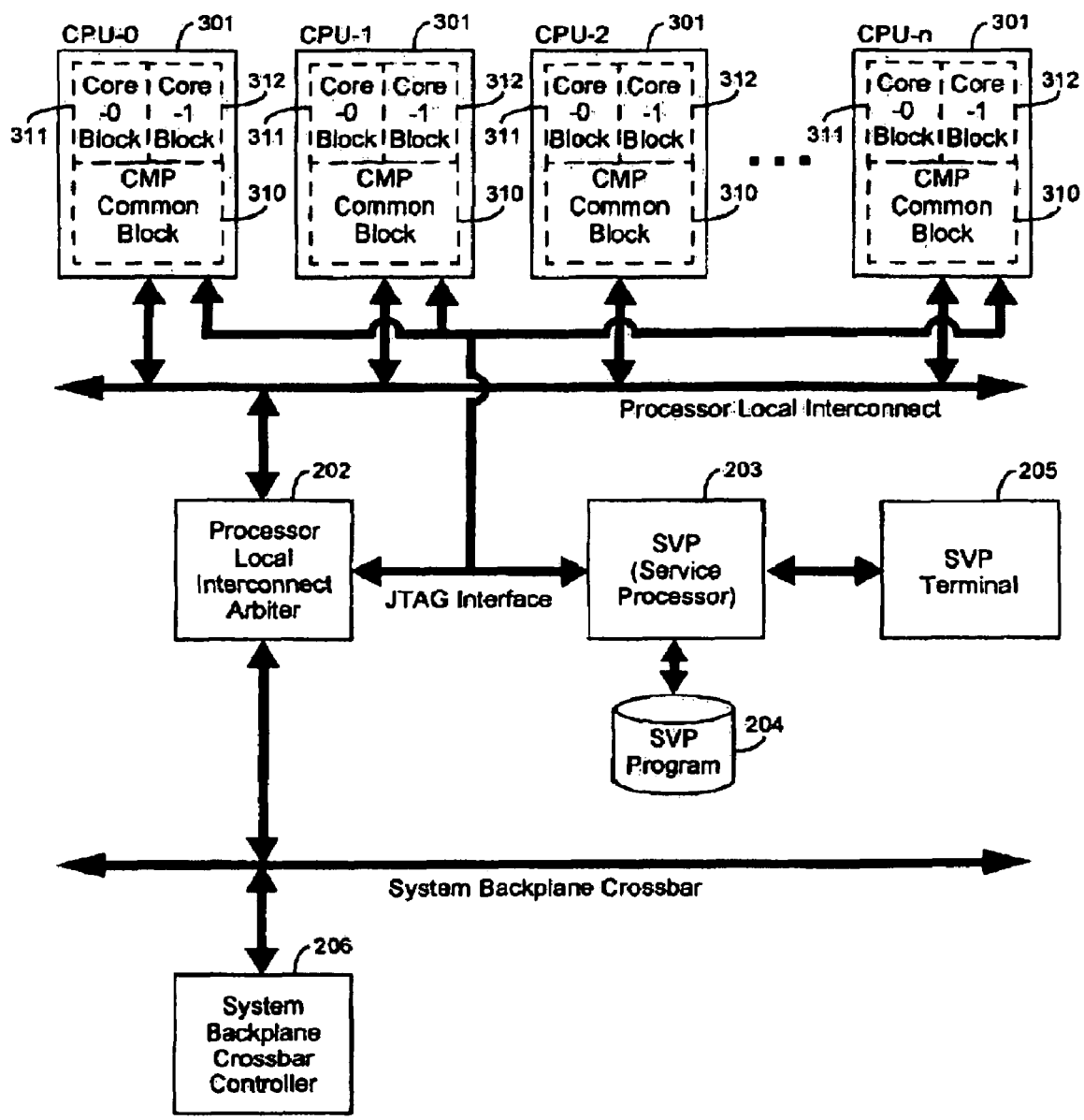
FIG. 3 is a drawing illustrating the configuration of server system using a multicore processor.
Figure 4:
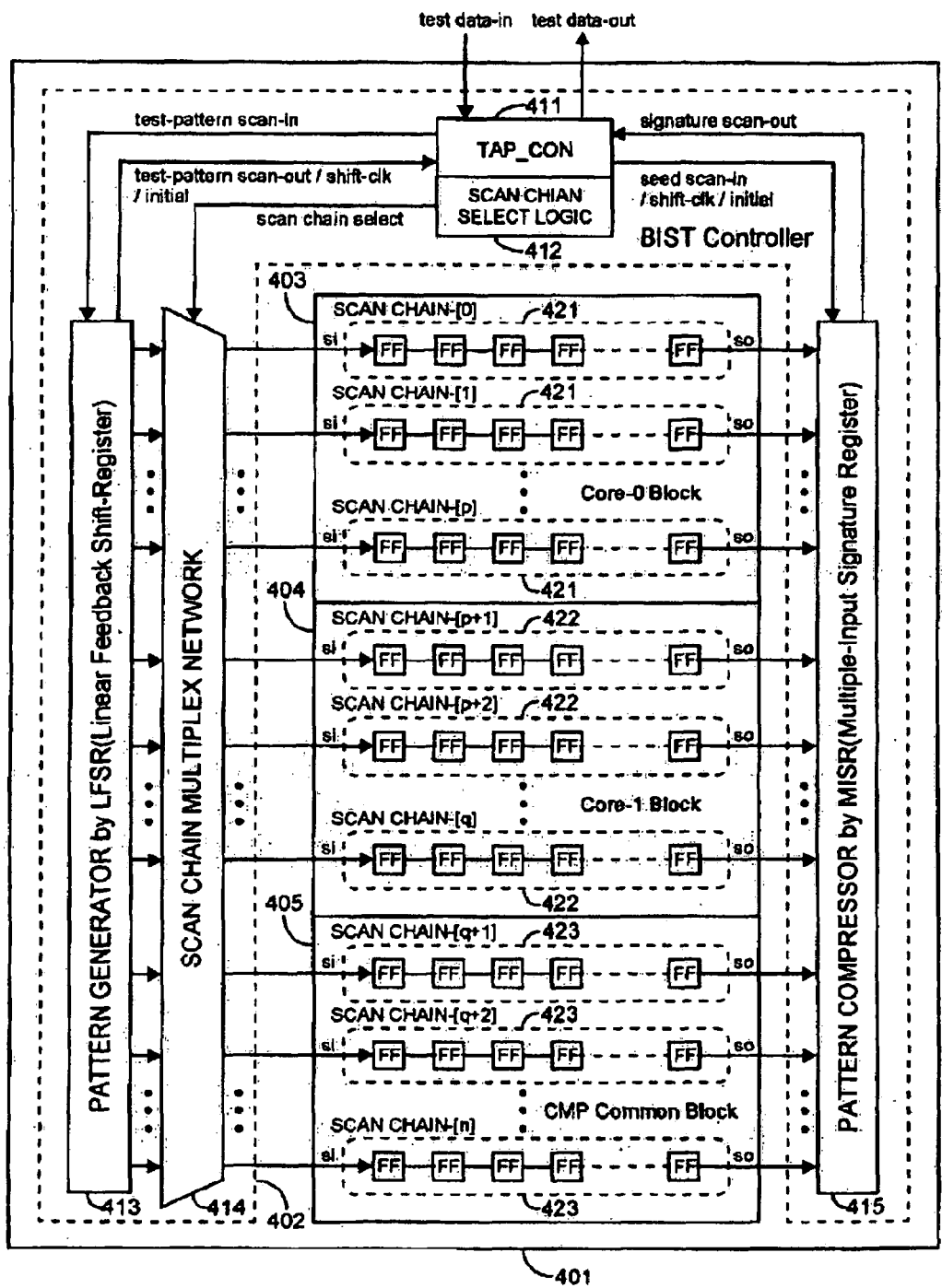
FIG. 4 is a drawing illustrating a conventional configuration of a logic BIST circuit in a multicore processor.
Figure 5:
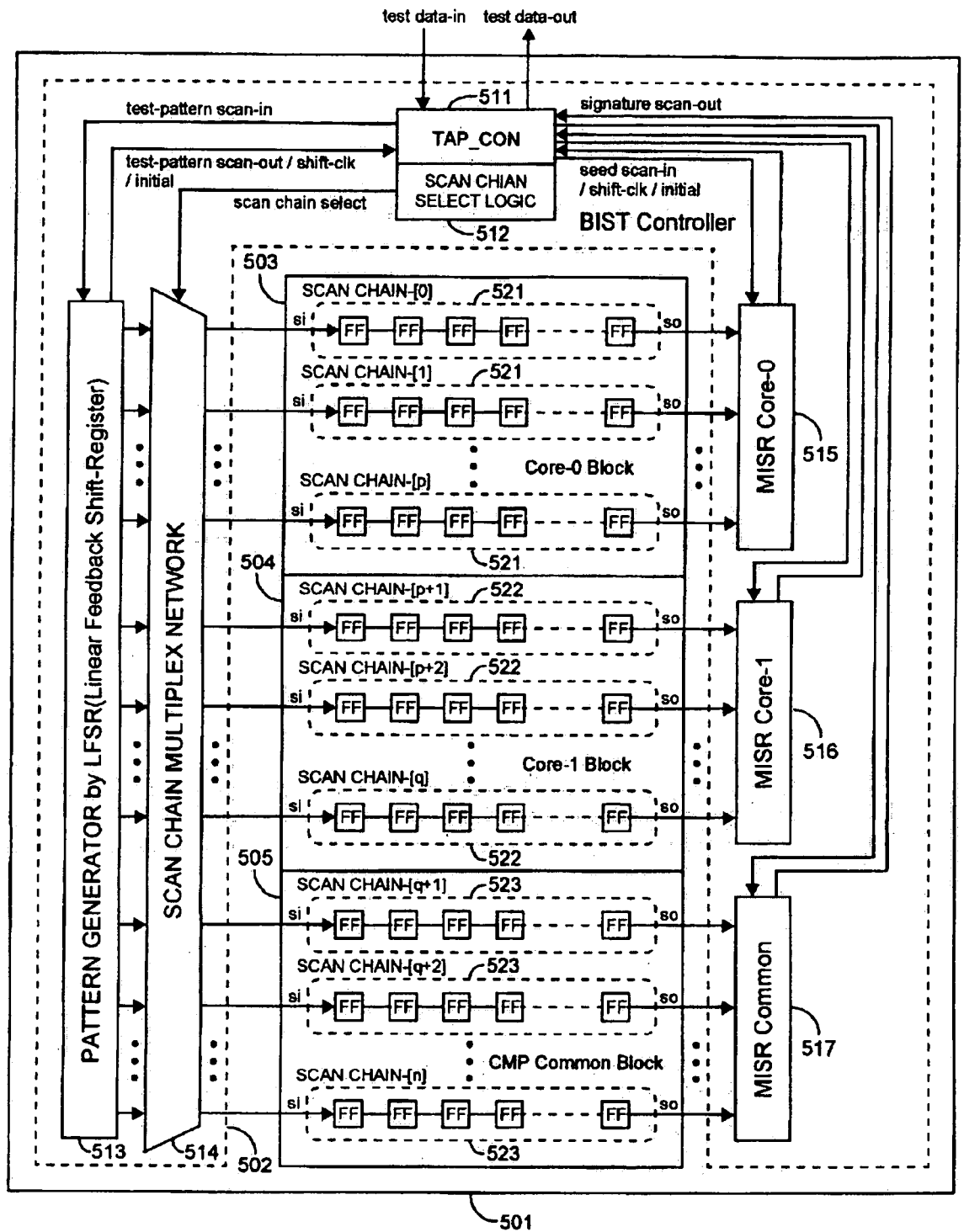
FIG. 5 is a drawing illustrating the configuration of the logic BIST circuit of a multicore processor in a first mode of embodiment.

FIG. 5 is a drawing illustrating a first mode of embodiment of the present invention for a 2-CMP multicore processor comprising two core blocks.

Processor 501 is a 2-CMP multicore processor comprising a logic BIST circuit block 502, core-0 block 503, core-1 block 504, and CMP common block 505. Furthermore, the logic BIST circuit block 502 contains a TAP controller 511, scan chain selection control circuit 512, LFSR test pattern generating circuit 513, scan chain switching MUX circuit 514, core-0 block MISR test pattern compression circuit 515, core-1 block MISR test pattern compression circuit 516, and CMP common block MISR test pattern compression circuit 517.

First, the scan chain selection control circuit 412 is controlled by the TAP controller 511 and the scan chain is switched by the scan chain switching MUX circuit 514 from system mode to logic BIST mode (scan chain select).

Then, an initial test pattern is transferred from the LSI tester (not illustrated) to the TAP controller 511 (test data-in). Next, the TAP controller 511 causes the initial test pattern to be scanned into LFSR test pattern generating circuit 513 (test pattern scan-in), and applies a shift clock (not illustrated) to said shift register, causing a pseudo-random number based test pattern to be generated as the output of the LFSR test pattern generating circuit 413. The generated test pattern passes through the scan chain switching MUX circuit 514 that is switched to logic BIST mode, and the generated test pattern is applied to core-0 block internal scan F/F chain 521, core-1 block internal scan F/F chain 522, and CMP common block internal scan F/F chain 523, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 521, core-1 block internal scan F/F chain 522, and CMP common block internal scan F/F chain 523 is inputted respectively into the core-0 block MISR test pattern compression circuit 515, core-1 block MISR test pattern compression circuit 516 and CMP common block MISR test pattern compression circuit 517.

The core-0 MISR test pattern compression circuit 515 furthermore scans seed data into the shift register for storing signatures comprised within the MISR test pattern compression circuit 515 (seed scan-in), and a shift clock (not illustrated) from the TAP controller 511 is applied, causing the test pattern to be compressed into a signature (nth order bit sequence data), which is outputted to the TAP controller 511 (signature scan-out).

Similarly, the core-1 MISR test pattern compression circuit 516 and the CMP common block MISR test pattern compression circuit 517 scan in seed data into the shift registers for storing signatures comprised within them (seed scan-in), and a shift clock (not illustrated) from the TAP controller 511 is applied, causing test patterns to be compressed into signatures (nth order bit sequence data), which are outputted to the TAP controller 511 (signature scan-out).

Signatures of the core-0 block 503, inputted from the MISR test pattern compression circuit 515 into the TAP controller 511, and of the core-1 block 504 and CMP common block 505, are transferred from the TAP controller 511 to the LSI tester (not illustrated) (test data-out), and are compared to the respective expected value data in the LSI tester to analyze the LSI test results. Namely, if the inputted signature of the logic block matches the corresponding expected value data, the test analysis result for that logic block will be 'pass,' and if it does not match, the test analysis result for that logic block will be 'fail.'

The test pattern generation operation in the LFSR test pattern generating circuit 513 and the test pattern compression operation in the core-0 block MISR test pattern compression circuit 515, core-1 block MISR test pattern compression circuit 516, and CMP common block MISR test pattern compression circuit 517 are described below with the aid of FIG. 11 and FIG. 12 respectively.

In the present mode of embodiment, the test patterns which have passed through the internal scan F/F chain of core-0 block 503, core-1 block 504 and CMP common block 505 respectively are inputted into the independent MISR test pattern compression circuit of the respective logic block, so the compressed test patterns are equal to the number of logic blocks of the entire LSI (3), and the expected value data compared in the LSI tester to the compressed test patterns are also equal to the number of logic blocks of the entire LSI (3).

Therefore, when the LSI in question contains a plurality of logic blocks, such as in a multicore processor, as in the first mode of embodiment disclosed in FIG. 5, the test patterns which have passed through the respective logic blocks, i.e. through the core-0 block 503, core-1 block 504 and CMP common block 505, are compressed independently into three signatures by the respective independent core-0 block MISR test pattern compression circuit 515, core-1 block MISR test pattern compression circuit 516 and CMP common block MISR test pattern compression circuit 517, thus making it easy to analyze test results for each of the individual logic blocks, core-0 block 503, core-1 block 504 and CMP common block 505, based on said three independent signatures, and furthermore having the effect of accelerating the comparison to expected value data in the LSI tester.

Namely, there is the effect that, since test results can be easily analyzed for each individual logic block based on three signatures, for example, if the test analysis results for one of either the core-0 block 503 or the core-1 block 504 and for the CMP common block 505 are 'pass,' then the processor 501 can be salvaged as a core-0 partially defect-free LSI or a core-1 partially defect-free LSI. Namely, in the case of a multicore processor having a plurality of cores, when the logic block for which failure is detected in the comparison of the signature of that logic block and the corresponding expected value data is not the CMP common block but rather a core block, by using the other logic block which is capable of normal operation instead, the processor can be salvaged as a partially defect-free LSI.

Figure 6:
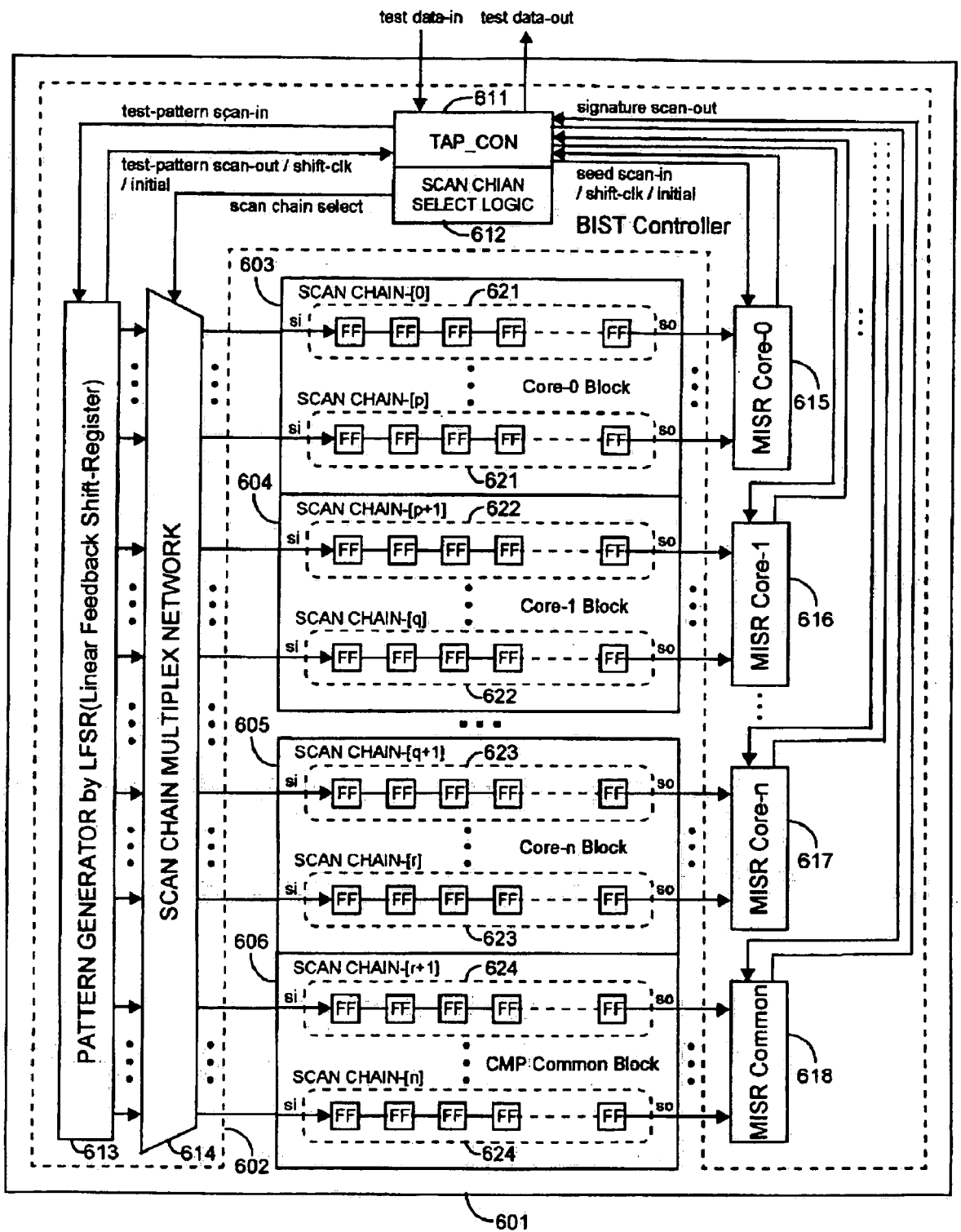
FIG. 6 is a drawing illustrating the configuration of the logic BIST circuit of a multicore processor in a second mode of embodiment.

FIG. 6 is a drawing illustrating a second mode of embodiment of the present invention for an n-CMP multicore processor comprising n core blocks (where n is a natural number no less than 3).

Processor 601 is an n-CMP multicore processor comprising a logic BIST circuit block 602, core-0 block 603, core-1 block 604, . . . , core-n block 605, and CMP common block 606. Furthermore, the logic BIST circuit block 602 contains a TAP controller 611, scan chain selection control circuit 612, LFSR test pattern generating circuit 613, scan chain switching MUX circuit 614, core-0 block MISR test pattern compression circuit 615, core-1 block MISR test pattern compression circuit 616, . . . , core-n block MISR test pattern compression circuit 617, and CMP common block MISR test pattern compression circuit 618.

First, the scan chain selection control circuit 612 is controlled by the TAP controller 611 and the scan chain is switched by the scan chain switching MUX circuit 614 from system mode to logic BIST mode (scan chain select).

Then, an initial test pattern is transferred from the LSI tester (not illustrated) to the TAP controller 611 (test data-in). Next, the TAP controller 611 controls the scan chain selection control circuit 612 and the scan chain is switched by the scan chain switching MUX circuit 614 from system mode to logic BIST mode (scan chain select).

Next, the TAP controller 611 causes the initial test pattern to be scanned into LFSR test pattern generating circuit 613 (test pattern scan-in), and applies a shift clock (not illustrated) to said shift register, causing a pseudo-random number based test pattern to be generated as the output of the LFSR test pattern generating circuit 613. The generated test pattern passes through the scan chain switching MUX circuit 614 that is switched to logic BIST mode, and the generated test pattern is applied to core-0 block internal scan F/F chain 621, core-1 block internal scan F/F chain 622, . . . , core-n block internal scan F/F chain 623, and CMP common block internal scan F/F chain 624, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 621, core-1 block internal scan F/F chain 622, . . . , core-n block internal scan F/F chain 623, and CMP common block internal scan F/F chain 624 is inputted respectively into the core-0 block MISR test pattern compression circuit 615, core-1 block MISR test pattern compression circuit 616, . . . , core-n block MISR test pattern compression circuit 617 and CMP common block MISR test pattern compression circuit 618.

The core-0 MISR test pattern compression circuit 615 furthermore scans seed data into the shift register for storing signatures comprised within the MISR test pattern compression circuit 615 (seed scan-in), and a shift clock (not illustrated) from said TAP controller 611 is applied, causing the test pattern to be compressed into a signature (nth order bit sequence data), which is outputted to the TAP controller 611 (signature scan-out).

Similarly, the core-1 MISR test pattern compression circuit 616, . . . , core-n block MISR test pattern compression circuit 617 and the CMP common block MISR test pattern compression circuit 618 scan in seed data into the shift registers for storing signatures comprised within them (seed scan-in), and a shift clock (not illustrated) from the TAP controller 611 is applied, causing test patterns to be compressed into signatures (nth order bit sequence data), which are outputted to the TAP controller 611 (signature scan-out).

Signatures of the core-0 block 603, inputted from said MISR test pattern compression circuit 615 into the TAP controller 611, and of the core-1 block 604, . . . , core-n block 605 and CMP common block 606, are transferred from the TAP controller 611 to the LSI tester (not illustrated) (test data-out), and are compared to the respective expected value data in the LSI tester to analyze the LSI test results. Namely, if the inputted signature of the logic block matches the corresponding expected value data, the test analysis result for that logic block will be 'pass,' and if it does not match, the test analysis result for that logic block will be 'fail.'

The test pattern generation operation in the LFSR test pattern generating circuit 613 and the test pattern compression operation in the core-0 block MISR test pattern compression circuit 615, core-1 block MISR test pattern compression circuit 616, core-n block MISR test pattern compression circuit 617 and CMP common block MISR test pattern compression circuit 618 are described below with the aid of FIG. 11 and FIG. 12 respectively.

In the present mode of embodiment, the test patterns which have passed through the scan F/F chain of core-0 block 603, core-1 block 604 and CMP common block 605 respectively are inputted into the independent MISR test pattern compression circuit of the respective logic block, so the compressed test patterns are equal to the number of logic blocks of the entire LSI (n+1), and the expected value data compared in the LSI tester to the compressed test patterns are also equal to the number of logic blocks of the entire LSI (n+1).

Therefore, when the LSI in question contains a plurality of logic blocks, such as in a multicore processor, as in the second mode of embodiment disclosed in FIG. 6, the test patterns which have passed through the respective logic blocks, i.e. through the core-0 block 603, core-1 block 604, . . . , core-n block 605 and CMP common block 606 are compressed independently into (n+1) signatures by the respective independent core-0 block MISR test pattern compression circuit 615, core-1 block MISR test pattern compression circuit 616, . . . , core-n block MISR test pattern compression circuit 617 and CMP common block MISR test pattern compression circuit 618, thus making it easy to analyze test results for each of the individual logic blocks, core-0 block 603, core-1 block 604, . . . , core-n block 605 and CMP common block 606, based on three independent signatures, and furthermore having the effect of accelerating the comparison to expected value data in the LSI tester.

Namely, there is the effect that, since test results can be easily analyzed for each individual logic block based on said n+1 signatures, for example, if the test analysis results for one or more of the core-0 block 603, core-1 block 604, . . . , core-n block 605 and for the CMP common block 606 are 'pass,' then the processor 601 can be salvaged as a partial core defect-free LSI. Namely, in the case of a multicore processor having a plurality of cores, when the logic block for which failure is detected in the comparison of the signature of that logic block and the corresponding expected value data is not the CMP common block but rather a core block, by using the other logic blocks which are capable of normal operation instead, the processor can be salvaged as a partially defect-free LSI.

Figure 7:
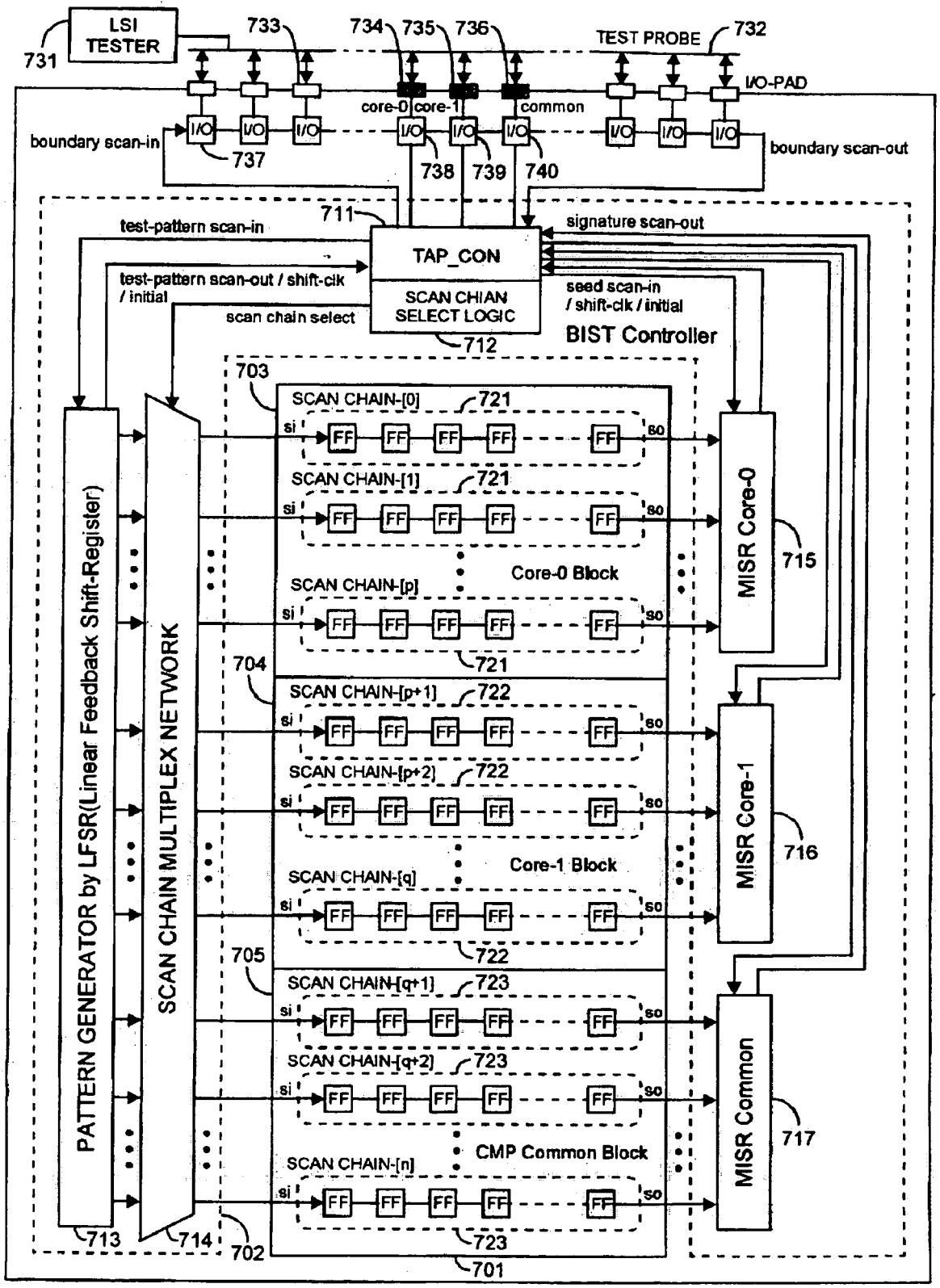
FIG. 7 is a drawing illustrating the configuration of the logic BIST circuit of a multicore processor in a third mode of embodiment.

FIG. 7 is a drawing illustrating a third mode of embodiment of the present invention for a 2-CMP multicore processor comprising two core blocks.

Processor 701 is a 2-CMP multicore processor comprising a logic BIST circuit block 702, core-0 block 703, core-1 block 704, and CMP common block 705. Furthermore, the logic BIST circuit block 702 contains a TAP controller 711, scan chain selection control circuit 712, LFSR test pattern generating circuit 713, scan chain switching MUX circuit 714, core-0 block MISR test pattern compression circuit 715, core-1 block MISR test pattern compression circuit 716, and CMP common block MISR test pattern compression circuit 717.

Moreover, processor 701 comprises an I/O pad 737 which provides a boundary scan chain and an I/O pad 733 which provides input and output to outside the LSI, as well as a core-0 block signature output I/O buffer 738, core-1 block signature output I/O buffer 739 and CMP common block signature output I/O buffer 740 corresponding respectively to the signature output from the core-0 block MISR test pattern compression circuit 715, core-1 block MISR test pattern compression circuit 716 and CMP common block MISR test pattern compression circuit 717, and also a core-0 block signature output I/O pad 734, core-1 block signature output I/O pad 735 and CMP common block signature output I/O pad 736.

First, the scan chain selection control circuit 712 is controlled by the TAP controller 711 and the scan chain is switched by the scan chain switching MUX circuit 714 from system mode to logic BIST mode (scan chain select).

Then, an initial test pattern is transferred from the LSI tester 731 to the TAP controller 711 (test data-in). Next, the TAP controller 711 causes the initial test pattern to be scanned into LFSR test pattern generating circuit 713 (test pattern scan-in), and applies a shift clock (not illustrated) to the shift register, causing a pseudo-random number based test pattern to be generated as the output of the LFSR test pattern generating circuit 413. The generated test pattern passes through the scan chain switching, MUX circuit 714 that is switched to logic BIST mode, and the generated test pattern is applied to core-0 block internal scan F/F chain 721, core-1 block internal scan F/F chain 722, and CMP common block internal scan F/F chain 723, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 721, core-1 block internal scan F/F chain 722, and CMP common block internal scan F/F chain 723 is inputted respectively into the core-0 block MISR test pattern compression circuit 715, core-1 block MISR test pattern compression circuit 716 and CMP common block MISR test pattern compression circuit 717.

The core-0 MISR test pattern compression circuit 715 furthermore scans seed data into the shift register for storing signatures comprised within the MISR test pattern compression circuit 715 (seed scan-in), and a shift clock (not illustrated) from said TAP controller 711 is applied, causing said test pattern to be compressed into a signature (nth order bit sequence data), which is outputted to the TAP controller 711 (signature scan-out).

Similarly, the core-1 MISR test pattern compression circuit 716 and the CMP common block MISR test pattern compression circuit 717 scan in seed data into the shift registers for storing signatures comprised within them (seed scan-in), and a shift clock (not, illustrated) from the TAP controller 711 is applied, causing test patterns to be compressed into signatures (nth order bit sequence data), which are outputted to the TAP controller 711 (signature scan-out).

Signatures of the core-0 block 703, inputted from the MISR test pattern compression circuit 715 into the TAP controller 711, and of the core-1 block 704 and CMP common block 705, are outputted in parallel from the TAP controller 711 respectively into the independent core-0 block signature output I/O buffer 738, core-1 block signature output I/O buffer 739 and CMP common block signature output I/O buffer 740. The core-0 block signature output I/O buffer 738, core-1 block signature output I/O buffer 739 and CMP common block signature output I/O buffer 740 are connected respectively to the corresponding independent core-0 block signature output I/O pad 734, core-1 block signature output I/O pad 735 and CMP common block signature output I/O pad 736, and the signatures of each of the logic blocks are transferred in parallel via the LSI tester probe 732 to the LSI tester 731. Here, the signatures transferred in parallel to the LSI tester 731 are compared independently to the corresponding expected value data to analyze the LSI test results. Namely, if the inputted signature of the logic block matches the corresponding expected value data, the test analysis result for that logic block will be 'pass,' and if it does not match, the test analysis result for that logic block will be 'fail.'

The test pattern generation operation in the LFSR test pattern generating circuit 713 and the test pattern compression operation in the core-0 block MISR test pattern compression circuit 715, core-1 block MISR test pattern compression circuit 716, and CMP common block MISR test pattern compression circuit 717 are described below with the aid of FIG. 11 and FIG. 12 respectively.

In the present mode of embodiment, the test patterns which have passed through the internal scan F/F chains of core-0 block 703, core-1 block 704 and CMP common block 705 respectively are inputted into the independent MISR test pattern compression circuit of the respective logic block, so the compressed test patterns are equal to the number of logic blocks of the entire LSI (3), and the expected value data compared in the LSI tester to the compressed test patterns are also equal to the number of logic blocks of the entire LSI (3).

Therefore, when the LSI in question contains a plurality of logic blocks, such as in a multicore processor, as in the third mode of embodiment disclosed in FIG. 7, the test patterns which have passed through the respective logic blocks, i.e. through the core-0 block 703, core-1 block 704 and CMP common block 705, are compressed independently into three signatures by the respective independent core-0 block MISR test pattern compression circuit 715, core-1 block MISR test pattern compression circuit 716 and CMP common block MISR test pattern compression circuit 717, thus making it easy to analyze test results for each of the individual logic blocks, core-0 block 703, core-1 block 704 and CMP common block 705, based on three independent signatures, and furthermore having the effect of accelerating the comparison to expected value data in the LSI tester.

Moreover, for the output of signatures of each logic block, transferring the signatures in parallel to the LSI tester 731 via the LSI tester probe 732 by means of the core-0 block signature output I/O buffer 738, core-1 block signature output I/O buffer 739 and CMP common block signature output I/O buffer 740, and the core-0 block signature output I/O pad 734, core-1 block signature output I/O pad 735 and CMP common block signature output I/O pad 736 has the effect of reducing transfer time to ⅓.

Namely, there is the effect that, since test results can be easily analyzed for each individual logic block based on three signatures, for example, if the test analysis results for one of either the core-0 block 703 or the core-1 block 704 and for the CMP common block 705 are 'pass,' then the processor 701 can be salvaged as a core-0 partially defect-free LSI or a core-1 partially defect-free LSI. Namely, in the case of a multicore processor having a plurality of cores, when the logic block for which failure is detected in the comparison of the signature of that logic block and the corresponding expected value data is not the CMP common block but rather a core block, by using the other logic block which is capable of normal operation instead, the processor can be salvaged as a partially defect-free LSI.

Figure 8:
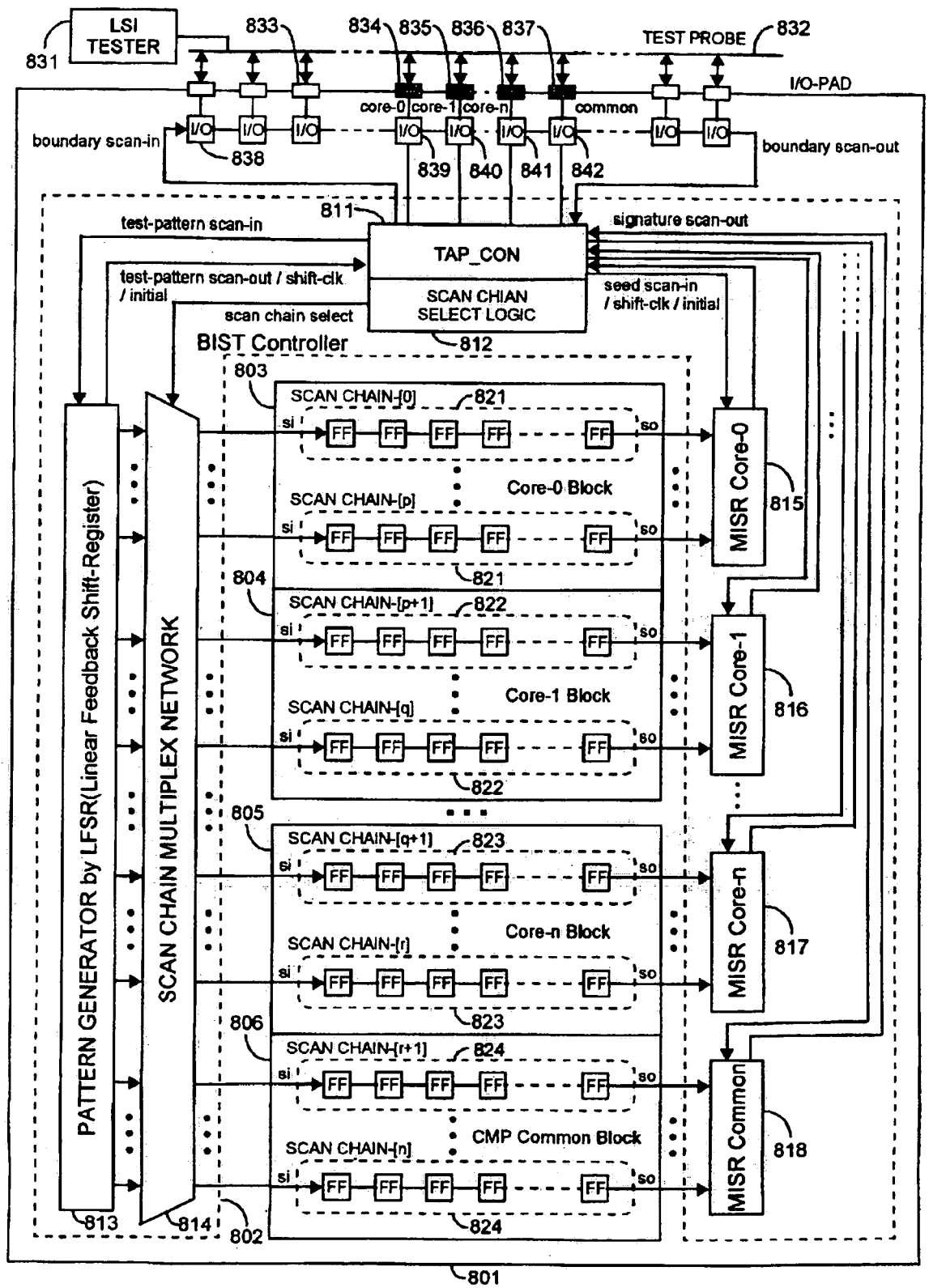
FIG. 8 is a drawing illustrating the configuration of the logic BIST circuit of a multicore processor in a fourth mode of embodiment.

FIG. 8 is a drawing illustrating a fourth mode of embodiment of the present invention for an n-CMP multicore processor comprising n core blocks (where n is a natural number no less than 3).

Processor 801 is an n-CMP multicore processor comprising a logic BIST circuit block 802, core-0 block 803, core-1 block 804, . . . , core-n block 805, and CMP common block 806. Furthermore, the logic BIST circuit block 802 contains a TAP controller 811, scan chain selection control circuit 812, LFSR test pattern generating circuit 813, scan chain switching MUX circuit 814, core-0 block MISR test pattern compression circuit 815, core-1 block MISR test pattern compression circuit 816, core-n block MISR test pattern compression circuit 817, and CMP common block MISR test pattern compression circuit 818.

Moreover, processor 801 comprises an I/O pad 838 which provides a boundary scan chain and an I/O pad 833 which provides input and output to outside the LSI, as well as a core-0 block signature output I/O buffer 839, core-1 block signature output I/O buffer 840, . . . , core-n block signature output I/O buffer 841 and CMP common block signature output I/O buffer 842 corresponding respectively to the signature output from the core-0 block MISR test pattern compression circuit 815, core-1 block MISR test pattern compression circuit 816, . . . , core-n block MISR test pattern compression circuit 817 and CMP common block MISR test pattern compression circuit 818, and also a core-0 block signature output I/O pad 834, core-1 block signature output I/O pad 835, . . . , core-n block signature output I/O pad 836 and CMP common block signature output I/O pad 837.

First, the scan chain selection control circuit 812 is controlled by the TAP controller 811 and the scan chain is switched by the scan chain switching MUX circuit 814 from system mode to logic BIST mode (scan chain select).

Then, an initial test pattern is transferred from the LSI tester 831 to the TAP controller 811 (test data-in). Next, the TAP controller 811 causes the initial test pattern to be scanned into LFSR test pattern generating circuit 813 (test pattern scan-in), and applies a shift clock (not illustrated) to the shift register, causing a pseudo-random number based test pattern to be generated as the output of the LFSR test pattern generating circuit 813. The generated test pattern passes through the scan chain switching MUX circuit 814 that is switched to logic BIST mode, and the generated test pattern is applied to core-0 block internal scan F/F chain 821, core-1 block internal scan F/F chain 822, . . . , core-n block internal scan F/F chain 823, and CMP common block internal scan F/F chain 824, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 821, core-1 block internal scan F/F chain 822, . . . , core-n block internal scan F/F chain 823, and CMP common block internal scan F/F chain 824 is inputted respectively into the core-0 block MISR test pattern compression circuit 815, core-1 block MISR test pattern compression circuit 816, . . . , core-n block MISR test pattern compression circuit 817 and CMP common block MISR test pattern compression circuit 818.

The core-0 MISR test pattern compression circuit 815 furthermore scans seed data into the shift register for storing signatures comprised within the MISR test pattern compression circuit 815 (seed scan-in), and a shift clock (not illustrated) from the TAP controller 811 is applied, causing the test pattern to be compressed into a signature (nth order bit sequence data), which is outputted to the TAP controller 811 (signature scan-out).

Similarly, the core-1 MISR test pattern compression circuit 816, . . . , core-n block MISR test pattern compression circuit 817 and the CMP common block MISR test pattern compression circuit 818 scan in seed data into the shift registers for storing signatures comprised within them (seed scan-in), and a shift clock (not illustrated) from the TAP controller 811 is applied, causing test patterns to be compressed into signatures (nth order bit sequence data), which are outputted to the TAP controller 811 (signature scan-out).

Signatures of the core-0 block 803, inputted from the MISR test pattern compression circuit 815 into the TAP controller 811, and of the core-1 block 804, core-n block 805 and CMP common block 806, are outputted in parallel from the TAP controller 811 respectively into the independent core-0 block signature output I/O buffer 839, core-1 block signature output I/O buffer 840, . . . , core-n block signature output I/O buffer 841, and CMP common block signature output I/O buffer 842. The core-0 block signature output I/O buffer 839, core-1 block signature output I/O buffer 840, . . . , core-n block signature output I/O buffer 841 and CMP common block signature output I/O buffer 842 are connected respectively to the corresponding independent core-0 block signature output I/O pad 834, core-1 block signature output I/O pad 835, . . . , core-n block signature output I/O pad 836 and CMP common block signature output I/O pad 837, and the signatures of each of the logic blocks are transferred in parallel via the LSI tester probe 832 to the LSI tester 831. Here, the signatures transferred in parallel to the LSI tester 831 are compared independently to the corresponding expected value data to analyze the LSI test results. Namely, if the inputted signature of the logic block matches the corresponding expected value data, the test analysis result for that logic block will be 'pass,' and if it does not match, the test analysis result for that logic block will be 'fail.'

The test pattern generation operation in the LFSR test pattern generating circuit 813 and the test pattern compression operation in the core-0 block MISR test pattern compression circuit 815, core-1 block MISR test pattern compression circuit 816, core-n block MISR test pattern compression circuit 817 and CMP common block MISR test pattern compression circuit 818 are described below with the aid of FIG. 11 and FIG. 12 respectively.

In the present mode of embodiment, the test patterns which have passed through the internal scan F/F chain of core-0 block 803, core-1 block 804, . . . , core-n block 805 and CMP common block 806 respectively are inputted into the independent MISR test pattern compression circuit of the respective logic block, so the compressed test-patterns are equal to the number of logic blocks of the entire LSI (n+1), and the expected value data compared in the LSI tester to the compressed test patterns are also equal to the number of logic blocks of the entire LSI (n+1).

Therefore, when the LSI in question contains a plurality of logic blocks, such as in a multicore processor, as in the fourth mode of embodiment disclosed in FIG. 8, the test patterns which have passed through the respective logic blocks, i.e. through the core-0 block 803, core-1 block 804, . . . , core-n block 805 and CMP common block 806 are compressed independently into (n+1) signatures by the respective independent core-0 block MISR test pattern compression circuit 815, core-1 block MISR test pattern compression circuit 816, . . . , core-n block MISR test pattern compression circuit 817 and CMP common block MISR test pattern compression circuit 818, thus making it easy to analyze test results for each of the individual logic blocks, core-0 block 803, core-1 block 804, . . . , core-n block 805 and CMP common block 806, based on three independent signatures, and furthermore having the effect of accelerating the comparison to expected value data in the LSI tester.

Moreover, for the output of signatures of each logic block, transferring the signatures in parallel to the LSI tester 831 via the LSI tester probe 832 by means of the core-0 block signature output I/O buffer 839, core-1 block signature output I/O buffer 840, . . . , core-n block signature output I/O buffer 841, and CMP common block signature output I/O buffer 842, and the core-0 block signature output I/O pad 834, core-1 block signature output I/O pad 835, . . . , core-n block signature output I/O pad 836, and CMP common block signature output I/O pad 837 has the effect of reducing transfer time to 1/(n+1).

Namely, there is the effect that, since test results can be easily analyzed for each individual logic block based on (n+1) signatures, for example, if the test analysis results for one or more of the core-0 block 803, core-1 block 804, . . . , core-n block 805 and for the CMP common block 806 are 'pass,' then the processor 801 can be salvaged as a partially defect-free LSI. Namely, in the case of a multicore processor having a plurality of cores, when the logic block for which failure is detected in the comparison of the signature of that logic block and the corresponding expected value data is not the CMP common block but rather a core block, by using the other logic blocks which are capable of normal operation instead, the processor can be salvaged as a partially defect-free LSI.

Figure 9:
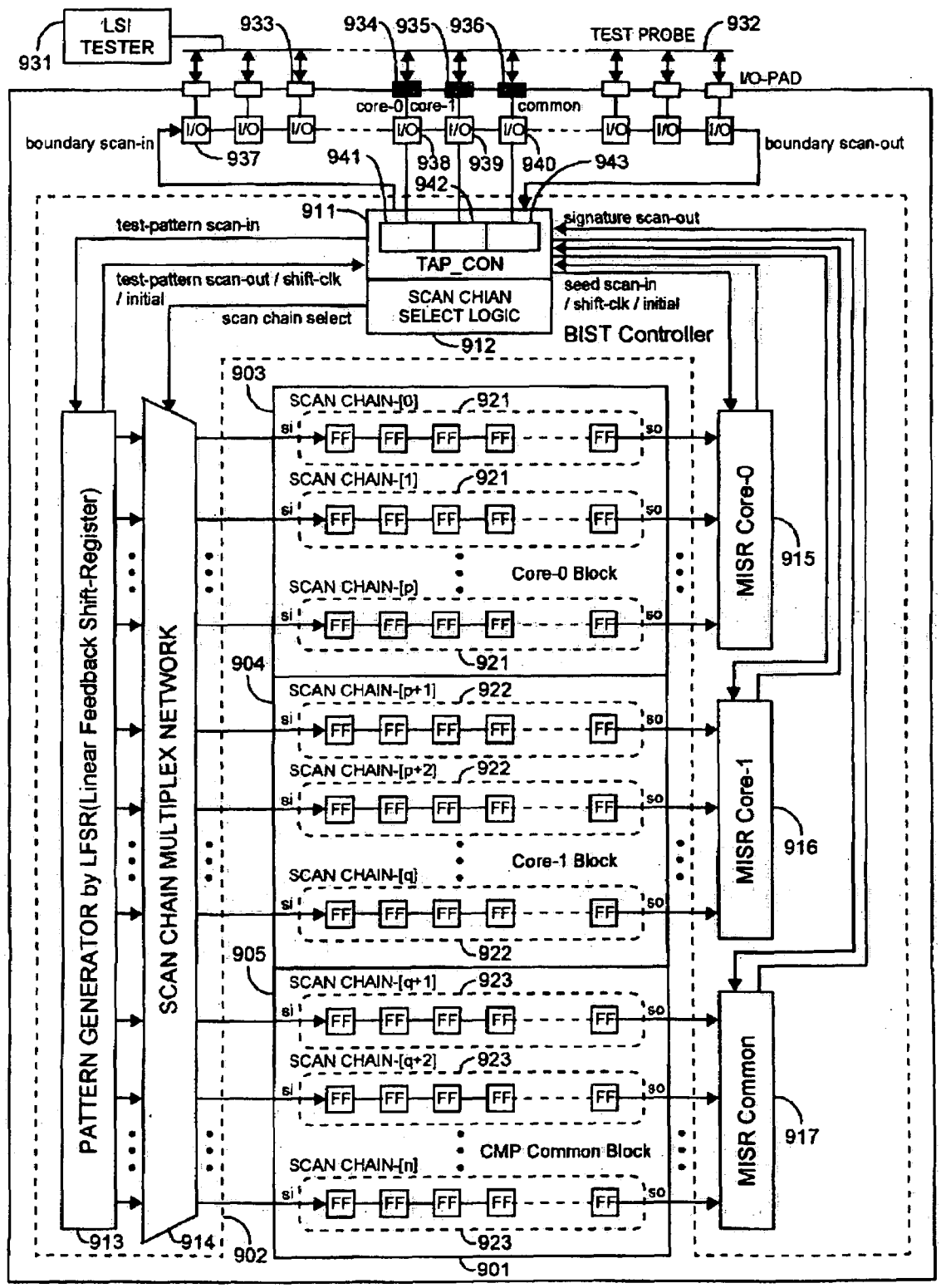
FIG. 9 is a drawing illustrating the configuration of the logic BIST circuit of a multicore processor in a fifth mode of embodiment.

FIG. 9 is a drawing illustrating a fifth mode of embodiment of the present invention for a 2-CMP multicore processor comprising two core blocks.

Processor 901 is a 2-CMP multicore processor comprising a logic BIST circuit block 902, core-0 block 903, core-1 block 904, and CMP common block 905. Furthermore, the logic BIST circuit block 902 contains a TAP controller 911, scan chain selection control circuit 912, LFSR test pattern generating circuit 913, scan chain switching MUX circuit 914, core-0 block MISR test pattern compression circuit 915, core-1 block MISR test pattern compression circuit 916, and CMP common block MISR test pattern compression circuit 917.

Furthermore, the TAP controller 911 contains inside it a core-0 block signature expected value data comparator circuit 941, core-1 block signature expected value data comparator circuit 942 and a CMP common block signature expected value data comparator circuit 943.

Moreover, processor 901 comprises an I/O pad 937 which provides a boundary scan chain and an I/O pad 933 which provides input and output to outside the LSI, as well as a core-0 block signature output I/O buffer 938, core-1 block signature output I/O buffer 939 and CMP common block signature output I/O buffer 940 corresponding respectively to the test analysis result output from the core-0 block signature expected value data comparator circuit 941, core-1 block signature expected value data comparator circuit 942, and CMP common block signature expected value data comparator circuit 943, and also a core-0 block signature output I/O pad 934, core-1 block signature output I/O pad 935, and CMP common block signature output I/O pad 936.

First, the scan chain selection control circuit 912 is controlled by the TAP controller 911 and the scan chain is switched by the scan chain switching MUX circuit 914 from system mode to logic BIST mode (scan chain select).

Then, an initial test pattern is transferred from the LSI tester 931 to the TAP controller 911, and the signature expected value data for the core-0 block, the signature expected value data for the core-1 block and the signature expected value data for the CMP common block are transferred respectively to the core-0 block signature expected value data comparator circuit 941, core-1 block signature expected value data comparator circuit 942, and CMP common block signature expected value data comparator circuit 943 in the TAP controller.

Next, the TAP controller 911 causes the initial test pattern to be scanned into LFSR test pattern generating circuit 913 (test pattern scan-in), and applies a shift clock (not illustrated) to the shift register, causing a pseudo-random, number based test pattern to be generated as the output of the LFSR test pattern generating circuit 913. The generated test pattern passes through the scan chain switching MUX circuit 914 that is switched to logic BIST mode, and the generated test pattern is applied to core-0 block internal scan F/F chain 921, core-1 block internal scan F/F chain 922, and CMP common block internal scan F/F chain 923, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 921, core-1 block internal scan F/F chain 922, and CMP common block internal scan F/F chain 923 is inputted respectively into the core-0 block MISR test pattern compression circuit 915, core-1 block MISR test pattern compression circuit 916, and CMP common block MISR test pattern compression circuit 917.

The core-0 MISR test pattern compression circuit 915 furthermore scans seed data into the shift register for storing signatures comprised within the MISR test pattern compression circuit 915 (seed scan-in), and a shift clock (not illustrated) from said TAP controller 911 is applied, causing the test pattern to be compressed into a signature (nth order bit sequence data), which is outputted to the TAP controller 911 (signature scan-out).

Similarly, the core-1 MISR test pattern compression circuit 916 and the CMP common block MISR test pattern compression circuit 917 scan in seed data into the shift registers for storing signatures comprised within them (seed scan-in), and a shift clock (not illustrated) from said TAP controller 911 is applied, causing test patterns to be compressed into signatures (nth order bit sequence data), which are outputted to the TAP controller 911 (signature scan-out).

The signatures of the core-0 block 903, inputted from the MISR test pattern compression circuit 915 into the TAP controller 911, and of the core-1 block 904 and CMP common block 905, are compared respectively in the core-0 block signature expected value data comparator circuit 941, core-1 block signature expected value data comparator circuit 942, and CMP common block signature expected value data comparator circuit 943 in the TAP controller 911 to the signature expected value data of the respective logic block that had been transferred in advance, thereby performing analysis of the LSI test results. Namely, if the inputted signature of the logic block matches the corresponding expected value data, the test analysis result for that logic block will be 'pass,' and if it does not match, the test analysis result for that logic block will be 'fail.'

The LSI test analysis result outputs of the core-0 block signature expected value data comparator circuit 941, core-1 block signature expected value data comparator circuit 942, and CMP common block signature expected value data comparator circuit 943 in the TAP controller 911 are outputted in parallel to the corresponding independent core-0 block test analysis result output I/O buffer 938, core-1 block test analysis result output I/O buffer 939 and CMP common block test analysis result output I/O buffer 940. The core-0 block test analysis result output I/O buffer 938, core-1 block test analysis result output I/O buffer 939, and CMP common block test analysis result output I/O buffer 940 are connected respectively to the corresponding independent core-0 block test analysis result output I/O pad 934, core-1 block test analysis result output I/O pad 935, and CMP common block test analysis result output I/O pad 936, and the LSI test analysis result outputs for each logic block are transferred in parallel via the LSI tester probe 932 to the LSI tester 931.

The test pattern generation operation in the LFSR test pattern generating circuit 913 and the test pattern compression operation in the core-0 block MISR test pattern compression circuit 915, core-1 block MISR test pattern compression circuit 916, and CMP common block MISR test pattern compression circuit 917 are described below with the aid of FIG. 11 and FIG. 12 respectively.

In the present mode of embodiment, the test patterns which have passed through the internal scan F/F chain of core-0 block 903, core-1 block 904, and CMP common block 905, respectively are inputted into the independent MISR test pattern compression circuit of the respective logic block, so the compressed test patterns are equal to the number of logic blocks of the entire LSI (3), and the expected value data compared in the LSI tester to the compressed test patterns are also equal to the number of logic blocks of the entire LSI (3).

Therefore, when the LSI in question contains a plurality of logic blocks, such as in a multicore processor, as in the fifth mode of embodiment disclosed in FIG. 9, the test patterns which have passed through the respective logic blocks, i.e. through the core-0 block 903, core-1 block 904 and CMP common block 905, are compressed independently into three signatures by the respective independent core-0 block MISR test pattern compression circuit 915, core-1 block MISR test pattern compression circuit 916, and CMP common block MISR test pattern compression circuit 917, and are compared to the signature expected value data for each logic block, which has been transferred in advance, in the core-0 block signature expected value data comparator circuit 941, core-1 block signature expected value data comparator circuit 942, and CMP common block signature expected value data comparator circuit 943 inside the TAP controller 911, thereby performing analysis of LSI test results, thus making it easy to analyze test results for each of the individual logic blocks, core-0 block 903, core-1 block 904, and CMP common block 905, based on three independent signatures, and furthermore having the effect of making comparison to expected value data in the LSI tester unnecessary.

Moreover, for the output of LSI test analysis results for each logic block, performing the output via the LSI test probe 932 in parallel to the LSI tester 931 using the corresponding independent core-0 block test analysis result output I/O buffer 938, core-1 block test analysis result output I/O buffer 939 and CMP common block test analysis result output I/O buffer 939, and the core-0 block test analysis result output I/O pad 934, core-1 block test analysis result output I/O pad 935 and CMP common block test analysis result output I/O pad 936, has the effect of making it possible to identify the processor 901 as completely defect-free LSI/partial core defect-free LSI/defective LSI the moment it is probed with the LSI tester probe 932 of the LSI tester 931.

Namely, there is the effect that, since test results can be easily analyzed for each individual logic block based on three signatures, for example, if the test analysis results for one of either the core-0 block 903 or the core-1 block 904 and for the CMP common block 905 are 'pass,' then the processor 901 can be salvaged as a core-0 partially defect-free LSI or a core-1 partially defect-free LSI. Namely, in the case of a multicore processor having a plurality of cores, when the logic block for which failure is detected in the comparison of the signature of that logic block and the corresponding expected value data is not the CMP common block but rather a core block, by using the other logic block which is capable of normal operation instead, the processor can be salvaged as a partially defect-free LSI.

Figure 10:
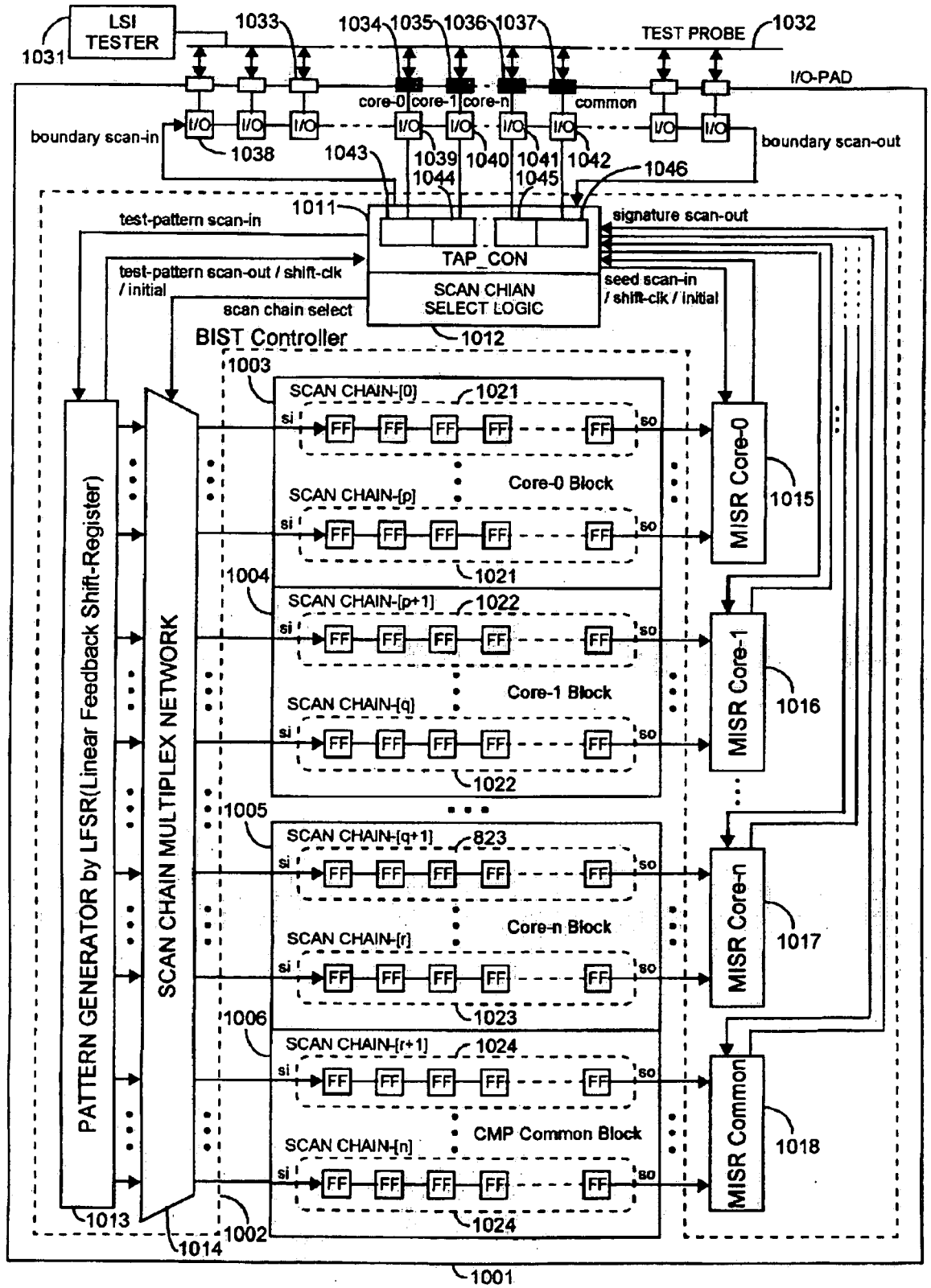
FIG. 10 is a drawing illustrating the configuration of the logic BIST circuit of a multicore processor in a sixth mode of embodiment.

FIG. 10 is a drawing illustrating a sixth mode of embodiment of the present invention for an n-CMP multicore processor comprising n core blocks (where n is a natural number no less than 3).

Processor 1001 is a 2-CMP multicore processor comprising a logic BIST circuit block 1002, core-0 block 1003, core-1 block 1004, . . . , core-n block 1005, and CMP common block 1006. Furthermore, the logic BIST circuit block 1002 contains a TAP controller 1011, scan chain selection control circuit 1012, LFSR test pattern generating circuit 1013, scan chain switching MUX circuit 1014, core-0 block MISR test pattern compression circuit 1015, core-1 block MISR test pattern compression circuit 1016, . . . , core-n block MISR test pattern compression circuit 1017, and CMP common block MISR test pattern compression circuit 1018.

Furthermore, the TAP controller 1011 contains inside it a core-0 block signature expected value data comparator circuit 1043, core-1 block signature expected value data comparator circuit 1044, . . . , core-n block signature expected value data comparator circuit 1045, and a CMP common block signature expected value data comparator circuit 1046.

Moreover, processor 1001 comprises an I/O pad 1038 which provides a boundary scan chain and an I/O pad 1033 which provides input and output to outside the LSI, as well as a core-0 block signature output I/O buffer 1039, core-1 block signature output I/O buffer 1040, core-n block signature output I/O buffer 1041, and CMP common block signature output I/O buffer 1042 corresponding respectively to the test analysis result output from the core-0 block signature expected value data comparator circuit 1043, core-1 block signature expected value data comparator circuit 1044, . . . , core-n block signature expected value data comparator circuit 1045, and CMP common block signature expected value data comparator circuit 1046, and also a core-0 block signature output I/O pad 1034, core-1 block signature output I/O pad 1035, . . . , core-n block signature output I/O pad 1036, and CMP common block signature output I/O pad 1037.

First, the scan chain selection control circuit 1012 is controlled by the TAP controller 1011 and the scan chain is switched by the scan chain switching MUX circuit 1014 from system mode to logic BIST mode (scan chain select).

Then, an initial test pattern is transferred from the LSI tester 1031 to the TAP controller 1011 and the signature expected value data for the core-0 block, the signature expected value data for the core-1 block, . . . , the signature expected value data for the core-n block and the signature expected value data for the CMP common block are transferred respectively to the core-0 block signature expected value data comparator circuit 1043, core-1 block signature expected value data comparator circuit 1044, . . . , core-n block signature expected value data comparator circuit 1045, and CMP common block signature expected value data comparator circuit 1046 in the TAP controller.

Next, the TAP controller 1011 causes the initial test pattern to be scanned into LFSR test pattern generating circuit 1013 (test pattern scan-in), and applies a shift clock (not illustrated) to the shift register, causing a pseudo-random number based test pattern to be generated as the output of the LFSR test pattern generating circuit 1013. The generated test pattern passes through the scan chain switching MUX circuit 1014 that is switched to logic BIST mode, and the generated test pattern is applied to core-0 block internal scan F/F chain 1021, core-1 block internal scan F/F chain 1022, . . . , core-n block internal scan F/F chain 1023, and CMP common block internal scan F/F chain 1024, and working each logic block circuit by applying a pulse of the system clock, resulting in setting the logically operated test patterns by the logic block circuit to the scan chains of each logic block circuit.

Furthermore, each test pattern that has passed through the core-0 block internal scan F/F chain 1021, core-1 block internal scan F/F chain 1022, . . . , core-n block internal scan F/F chain 1023, and CMP common block internal scan F/F chain 1024 is inputted respectively into the core-0 block MISR test pattern compression circuit 1015, core-1 block MISR test pattern compression circuit 1016, . . . , core-n block MISR test pattern compression circuit 1017, and CMP common block MISR test pattern compression circuit 1018.

The core-0 MISR test pattern compression circuit 1015 furthermore scans seed data into the shift register for storing signatures comprised within the MISR test pattern compression circuit 1015 (seed scan-in), and a shift clock (not illustrated) from the TAP controller 1011 is applied, causing the test pattern to be compressed into a signature (nth order bit sequence data), which is outputted to the TAP controller 1011 (signature scan-out).

Similarly, the core-1 MISR test pattern compression circuit 1016, . . . , core-n block MISR test pattern compression circuit 1017, and the CMP common block MISR test pattern compression circuit 1018 scan in seed data into the shift registers for storing signatures comprised within them (seed scan-in), and a shift clock (not illustrated) from the TAP controller 1011 is applied, causing test patterns to be compressed into signatures (nth order bit sequence data), which are outputted to the TAP controller 1011 (signature scan-out).

Signatures of the core-0 block 1003, inputted from the MISR test pattern compression circuit 1015 into the TAP controller 1011, and of the core-1 block 1004, . . . , core-n block 1005 and CMP common block 1006, are compared respectively in the core-0 block signature expected value data comparator circuit 1043, core-1 block signature expected value data comparator circuit 1044, . . . , core-n block signature expected value data comparator circuit 1045, and CMP common block signature expected value data comparator circuit 1046 in the TAP controller 1011 to the signature expected value data of the respective logic block that had been transferred in advance, thereby performing analysis of the LSI test results. Namely, if the inputted signature of the logic block matches the corresponding expected value data, the test analysis result for that logic block will be 'pass,' and if it does not match, the test analysis result for that logic block will be 'fail.'

The LSI test analysis result outputs of the core-0 block signature expected value data comparator circuit 1043, core-1 block signature expected value data comparator circuit 1044, . . . , core-n block signature expected value data comparator circuit 1045, and CMP common block signature expected value data comparator circuit 1046 in the TAP controller 1011 are outputted in parallel to the corresponding independent core-0 block test analysis result output I/O buffer 1039, core-1 block test analysis result output I/O buffer 1040, . . . , core-n block test analysis result output I/O buffer 1041, and CMP common block test analysis result output I/O buffer 1042. The core-0 block test analysis result output I/O buffer 1039, core-1 block test analysis result output I/O buffer 1040, . . . , core-n block test analysis result output I/O buffer 1041, and CMP common block test analysis result output I/O buffer 1042 are connected respectively to the corresponding independent core-0 block test analysis result output I/O pad 1034, core-1 block test analysis result output I/O pad 1035, . . . , core-1 block test analysis result output I/O pad 1036, and CMP common block test analysis result output I/O pad 1037, and the LSI test analysis result outputs for each logic block are transferred in parallel via the LSI tester probe 1032 to the LSI tester 1031.

The test pattern generation operation in the LFSR test pattern generating circuit 1013 and the test pattern compression operation in the core-0 block MISR test pattern compression circuit 1015, core-1 block MISR test pattern compression circuit 1016, . . . , core-n block MISR test pattern compression circuit 1017, and CMP common block MISR test pattern compression circuit 1018 are described below with the aid of FIG. 11 and FIG. 12 respectively.

In the present mode of embodiment, the test patterns which have passed through the internal scan F/F chain of core-0 block 1003, core-1 block 1004, . . . , core-n block 1005, and CMP common block 1006, respectively, are inputted into the independent MISR test pattern compression circuit of the respective logic block, so the compressed test patterns are equal to the number of logic blocks of the entire LSI (n+1), and the expected value data compared in the LSI tester to the compressed test patterns are also equal to the number of logic blocks of the entire LSI (n+1).

Therefore, when the LSI in question contains a plurality of logic blocks, such as in a multicore processor, as in the sixth mode of embodiment disclosed in FIG. 10, the test patterns which have passed through the respective logic blocks, i.e. through the core-0 block 1003, core-1 block 1004, . . . , core-n block 1005, and CMP common block 1006, are compressed independently into n+1 signatures by the respective independent core-0 block MISR test pattern compression circuit 1015, core-1 block MISR test pattern compression circuit 1016, . . . , core-n block MISR test pattern compression circuit 1017, and CMP common block MISR test pattern compression circuit 1018, and are compared to the signature expected value data for each logic block, which has been transferred in advance, in the core-0 block signature expected value data comparator circuit 1043, core-1 block signature expected value data comparator circuit 1044, . . . , core-n block signature expected value data comparator circuit 1045, and CMP common block signature expected value data comparator circuit 1046 inside the TAP controller 1011, thereby performing analysis of LSI test results, thus making it easy to analyze test results for each of the individual logic blocks, core-0 block 1003, core-1 block 1004, . . . , core-n block 1005, and CMP common block 1006, based on n+1 independent signatures, and furthermore having the effect of making comparison to expected value data in the LSI tester unnecessary.

Moreover, for the output of LSI test analysis results for each logic block, performing the output via the LSI test probe 1032 in parallel to the LSI tester 1031 using the corresponding independent core-0 block test analysis result output I/O buffer 1039, core-1 block test analysis result output I/O buffer 1040, . . . , core-n block test analysis result output I/O buffer 1041, and CMP common block test analysis result output I/O buffer 1042, and the core-0 block test analysis result output I/O pad 1034, core-1 block test analysis result output I/O pad 1035, . . . , core-n block test analysis result output I/O pad 1036, and CMP common block test analysis result output I/O pad 1037, has the effect of making it possible to identify the processor 1001 as completely defect-free LSI/partial core defect-free LSI/defective LSI the moment it is probed with the LSI tester probe 1032 of the LSI tester 1031.

Namely, there is the effect that, since test results can be easily analyzed for each individual logic block based on signatures, for example, if the test analysis results for one or more of the core-0 block 1003, core-1 block 1004, . . . , core-n block 1005, and for the CMP common block 1006 are 'pass,' then the processor 1001 can be salvaged as a partially defect-free LSI. Namely, in the case of a multicore processor having a plurality of cores, when the logic block for which failure is detected in the comparison of the signature of that logic block and the corresponding expected value data is not the CMP common block but rather a core block, by using the other logic blocks which are capable of normal operation instead, the processor can be salvaged as a partially defect-free LSI.

Figure 11:
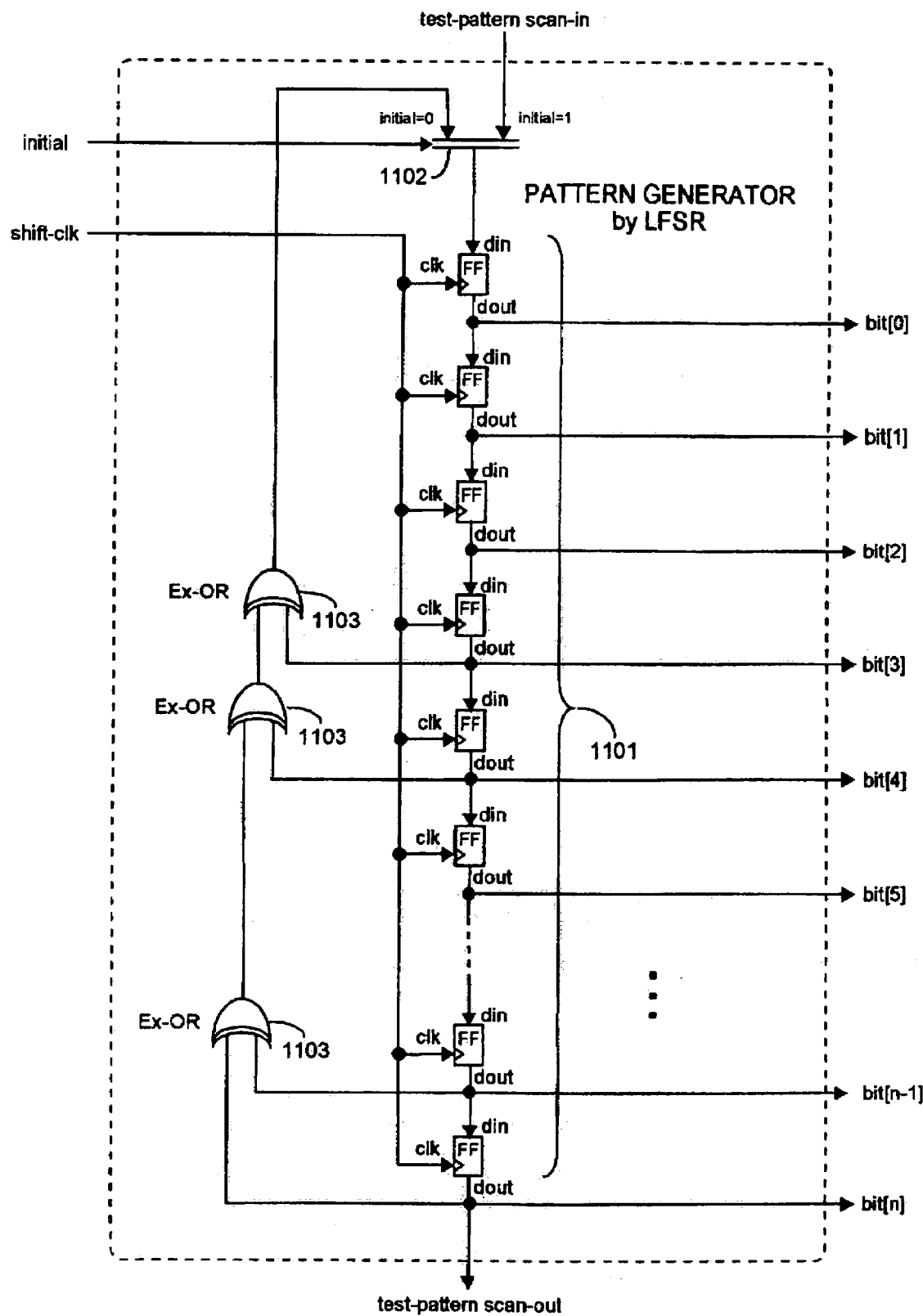
FIG. 11 is a drawing illustrating the configuration of the LFSR pattern generating circuit in the first through sixth modes of embodiment.

FIG. 11 is a drawing illustrating the configuration of the n-bit LFSR test pattern generating circuit in the first through sixth modes of embodiment. The LFSR (Linear Feedback Shift Register) based test pattern generating circuit is a circuit which generates pseudo-random numbers by applying feedback by means of an Ex-OR logic gate (exclusive OR logic gate) by applying a clock after setting an initial value, and is a technology well known to persons skilled in the art.

Below, the configuration of FIG. 11 will be simply described. The LFSR test pattern generating circuit of FIG. 11 comprises a shift register 1101, multiplexer 1102 and Ex-OR logic gate 1103. Here, the shift register 1101 has a width of (n+1) bits, and is bit-shifted by impressing a shift clock. The multiplexer 1102 performs input of initial values and switching of feedback input. The Ex-OR logic gate 1103 generates an exclusive OR, taking as input the appropriate F/F output in the bit sequence of the shift register 1101. It should be noted that the bit positions at which the input of the Ex-OR gate is connected as disclosed in FIG. 11 are only an example, and will vary depending on test pattern being generated.

Next, the operation of FIG. 11 will be simply described. First, initial=1 is inputted as the select input signal of the multiplexer 1102, and initial value data is scanned in. After scanning in initial value data, initial=0 is inputted as the select signal input of the multiplexer 1102. Then, by applying a shift clock, the bit sequence of the shift register is shifted by one bit at a time, and the feedback output from the Ex-OR logic gate circuit is inputted into the shift register as the new bit. A $(2^n-1)$ pseudo-random number based test pattern can be generated by repeating the above.

Figure 12:
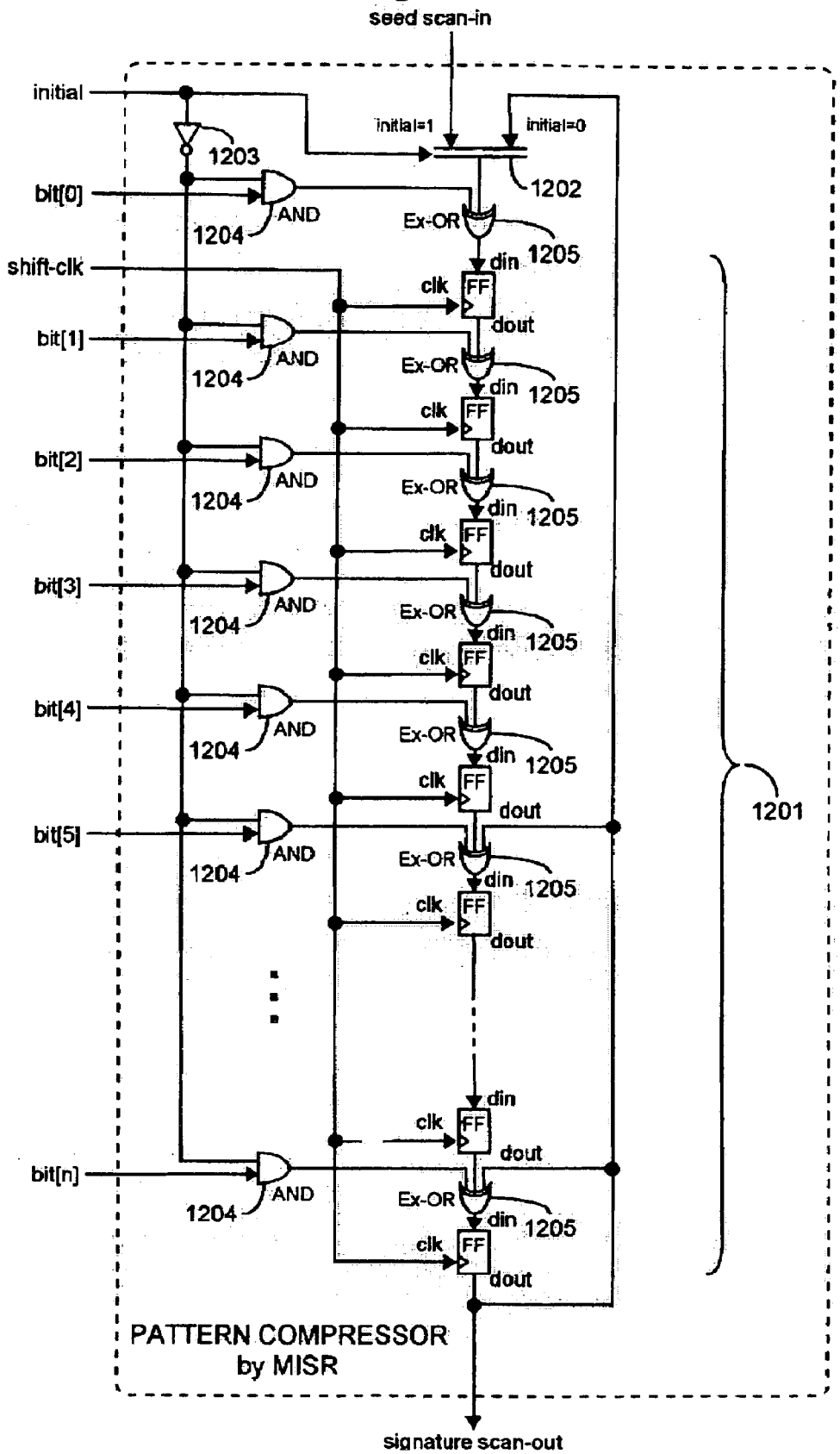
FIG. 12 is a drawing illustrating the configuration of the MZSR pattern compression circuit in the first through sixth modes of embodiment.

FIG. 12 is a drawing illustrating the configuration of the n-bit MISR test pattern compression circuit in the first through sixth modes of embodiment. An MISR (Multiple Input Signature Register) based test pattern compression circuit is a circuit which compresses a test pattern into a signature (nth order bit sequence data) by applying feedback using an Ex-OR logic gate (exclusive OR gate) circuit by applying a clock after setting a seed value, and is a technology well known to persons skilled in the art.

Below, the configuration of FIG. 12 will be simply described. The MISR test pattern compression circuit of FIG. 12 comprises a shift register 1201, multiplexer 1202, inverter 1203, AND logic gate 1204 and Ex-OR logic gate 1205. Here, the shift register 1201 has a width of (n+1) bits, and is bit-shifted by applying a shift clock. The multiplexer 1202 switches between seed value input and feedback input. The inverter 1203 performs inversion of the initial input. The AND logic gate 1204 prevents input to the Ex-OR logic gate 1205 based on the output of the inverter 1203. The Ex-OR logic gate 1205 generates an exclusive OR, taking as input the test pattern that has passed through the circuit being tested, the output of the immediately preceding F/F in the bit sequence making up the shift register, and the appropriate F/F output in the bit sequence of the shift register 1201, and outputs it into the input of the immediately following F/F. It should be noted that the position of the Ex-OR logic gate to which the output of the last bit in the shift register 1101 is connected as disclosed in FIG. 12 is only an example, and will vary depending on the signatures being compressed.

Next, the operation of FIG. 12 will be simply described. First, initial=1 is inputted as the select signal input of the multiplexer 1202, and the seed data is scanned in. After scanning in seed data, initial=0 is inputted as the select input signal of the multiplexer 1202. Then, by applying a shift clock, the bit sequence of the shift register is shifted one bit at time, an exclusive OR is generated taking as input the test pattern that has passed through the circuit being tested, the output of the immediately preceding F/F in the bit sequence making up the shift register, and the appropriate F/F output in the bit sequence of the shift register 1201, and is used as new input to the F/Fs in the bit sequence of the shift register 1201. By repeating the above, the test pattern that has passed through the circuit being tested can be compressed into nth order bit sequence data called a signature.

Figure 13:
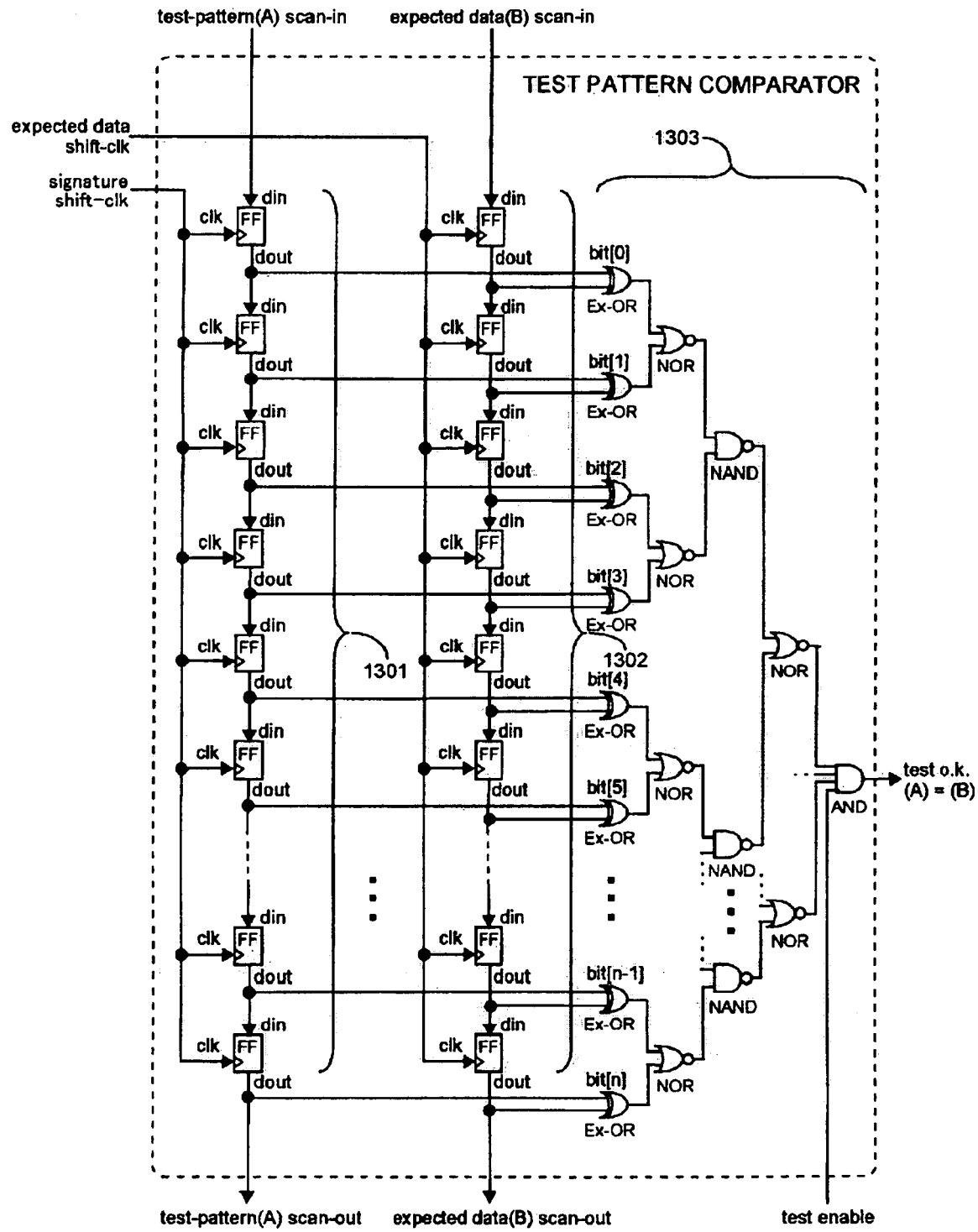
FIG. 13 is a drawing illustrating the configuration of the signature expected value data comparator circuit in the fifth and sixth modes of embodiment.

FIG. 13 is a drawing illustrating the configuration of the signature expected value data comparator circuit in the fifth mode of embodiment and the sixth mode of embodiment. The signature expected value data comparator circuit is a circuit which outputs the analysis results for the LSI test by comparing the signature constituting the output of the MISR test pattern compression circuit against the expected value data for that signature.

Below, the configuration of FIG. 13 will be simply described. The signature expected value data comparator circuit of FIG. 13 comprises a signature shift register 1301, expected value data shift register 1302 and comparator 1303.

Here, the signature shift register 1301 has a width of (n+1) bits, and is bit-shifted by applying a shift clock. The expected value data shift register 1302 has a width of (n+1) bits and is bit-shifted by applying a shift clock. The comparator 1303 performs comparison between the output of the signature shift register 1301 and the output of the expected value data shift register 1302.

Next, the operation of FIG. 13 will be simply described. First, test enable=0 is inputted into the comparator 1303, stopping comparator output. Then, the expected value data for the signature is scanned in by applying a shift clock to the expected value data shift register 1302. Next, the signature, which is the output of the MISR test pattern compression circuit, is scanned in by applying a shift clock to the signature shift register. Finally, test enable=1 is inputted into the comparator 1303, and the test analysis result for the LSI test is outputted through the test output.

Figure 14:
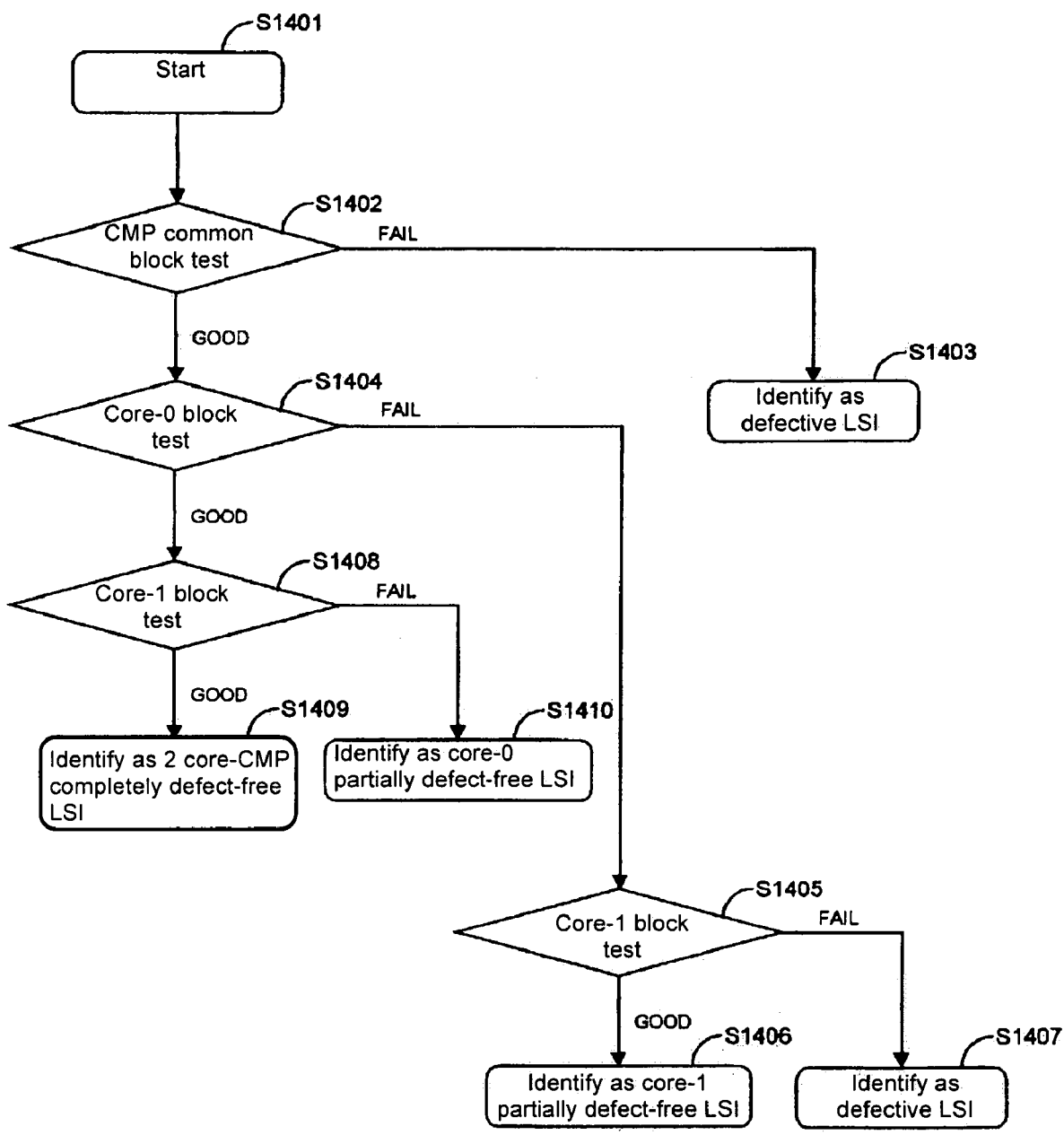
FIG. 14 is a flow chart representing the procedure of LSI test result analysis for a 2-CMP processor in the first, third and fifth modes of embodiment.

FIG. 14 is a flow chart representing the procedure of LSI test result analysis for the 2-CMP processor in the first, third and fifth modes of embodiment.

The procedure of FIG. 14 is described below. First, after staring the LSI test result analysis, the test result for the CMP common block is analyzed (operation S1402). If the analysis result in operation S1402 is FAIL, the LSI being tested is identified as a defective LSI (operation S1403). This is because it cannot function as a processor even if the core blocks are functional in cases where a CMP common block having a level-2 common cache is not functioning.

If the analysis result in operation S1402 is GOOD, the test result for the core-1 block is furthermore analyzed (operartion S1404). If the analysis result in operation S1404 is FAIL, the test result for the core-1 block is further analyzed operation (S1405). If the analysis result in operation S1405 is FAIL, the LSI being tested is identified as a defective LSI (operation S1407). This is because even if the CMP common block is operating normally, if neither of the core blocks is functioning, the LSI cannot function as a processor. Furthermore, if the analysis result in operation 1405 is GOOD, the LSI being tested is identified as a core-1 partially defect-free LSI (operation S1406). This is because the CMP common block and the core-1 block are functioning normally.

Here, if the analysis result in operation S1404 is GOOD, the test result for core-1 is further analyzed (operation S1408). If the analysis result in operation S1408 is FAIL, the LSI being tested is identified as a core-0 partially defect-free LSI (operation S1410). This is because the CMP common block and the core-0 block are functioning normally. Furthermore, if the analysis result in operation S1408 is GOOD, the LSI being tested is identified as a 2 core-CMP completely defect-free LSI (operation S1409). This is because the CMP common block, core-0 block and core-1 block are functioning normally.

All, the result analysis operations (operation S1402, operation S1404, operation S1405, and operation S1408) are for performing analysis in the LSI tester in the first and third modes of embodiment; in the fifth mode of embodiment, the analysis is performed in the signature expected value data comparator circuit.

Moreover, while FIG. 14 discloses a flow chart representing the procedure of LSI test result analysis for a 2-CMP processor in the first, third and fifth modes of embodiment, by expanding the branching in flow chart, it is possible to create a flow chart representing the procedure of LSI test result analysis for an n-CMP processor in the second, fourth and sixth modes of embodiment.

The first through sixth modes of embodiment of the present invention have been described and discussed in detail above with reference to the drawings. However, the specific configuration examples are not limited to these modes of embodiment 1 through 6, and design modifications and the like are included in the present invention so long as they do not depart from the spirit of the present invention.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A processor comprising:
a plurality of logic block circuits, said plurality of logic block circuits comprising at least a first processor core circuit and a second processor core circuit, each processor core circuit having a scan chain circuit and being operable independently, and a common block circuit having a scan chain circuit and a cache circuit that is shared by said first processor core circuits and said second processor core circuits;
a test pattern generating circuit operable to generate a test pattern and input the test pattern to all of the scan chains of each said logic block circuit; and
a plurality of test pattern compression circuits operable to accept as input and compress a test pattern output by the scan chain of each said logic block circuit, wherein said each test pattern compression circuit respectively connected to corresponding said logic block circuit.

2. A processor as set forth in claim 1 wherein:
said processor further comprises a TAP controller circuit; and
said pattern generating circuits comprises a shift register circuit;
wherein said TAP controller circuit is operable to:
set an initial value in said shift register circuit,
apply a shift clock causing said pattern generating circuit to generate a test pattern for testing each said logic block circuit in said shift register circuit, and
input said generated test pattern into a scan chain of each said logic block circuit.

3. A processor as set forth in claim 1 wherein:
said processor further comprises a TAP controller circuit; and
said pattern compression circuit comprises a shift register circuit;
wherein said pattern compression circuit is operable to:
accepts as input the test pattern output by a scan chain of each said logic block circuit, and
said TAP controller circuit applies a shift clock causing said pattern compression circuits to compress said pattern in said shift register circuits.

4. A processor as set forth in claim 1 wherein:
said processor further comprises, for each logic block circuit, a test analyzer circuit connected to said test pattern compression circuit, and
each said test analyzer circuit is operable to output test analysis results for a corresponding logic block circuit.

5. A processor as set forth in claim 4, wherein:
said test analyzer circuit comprises:
a first storing circuit operable to store a signature that constitutes results of compression by said test pattern compression circuit;
a second storing circuit operable to store expected value data for said signature; and
a comparator circuit operable to output test analysis results for given logic block circuits by comparing said signature and expected value data for said signature.

6. A processor as set forth in claim 1 wherein:
said processor comprises, for each said logic block circuit, an I/O pad connected to an output of the test pattern compression circuit of each said logic block circuit.

7. A processor as set forth in claim 1 wherein:
said processor comprises, for each said logic block circuit, an I/O pad connected to an output of test analyzer circuit of each said logic block circuit.

8. A processor comprising a plurality of logic block circuits, said plurality of logic block circuits comprising at least a first through nth processor core circuits, each processor core circuit having a scan chain circuit and being operable independently, and a common block circuit having a scan chain circuit and a cache circuit that is shared by said first through nth processor core circuits,
a test pattern generating circuit operable to generate a test pattern and input the test pattern to all of said logic block circuits; and
a plurality of test pattern compression circuits operable to accept as input and compress a test pattern output by the scan chain of each said logic block circuit, wherein said each test pattern compression circuit respectively connected to corresponding said logic block circuit.

9. A processor as set forth in claim 8 wherein:
said processor further comprises a TAP controller circuit; and
said pattern generating circuits comprises a shift register circuit;
wherein said TAP controller circuit is operable to:
set an initial value in said shift register circuit,
apply a shift clock causing said pattern generating circuit to generate a test pattern for testing each said logic block circuit in said shift register circuit, and input said generated test pattern into a scan chain of each said logic block circuit.

10. A processor as set forth in claim 8 wherein:
said processor further comprises a TAP controller circuit; and
said pattern compression circuit comprises a shift register circuit;
wherein said pattern compression circuit is operable to:
accepts as input the test pattern output by a scan chain of each said logic block circuit, and
said TAP controller circuit applies a shift clock causing said pattern compression circuits to compress said pattern in said shift register circuits.

11. A processor as set forth in claim 8 wherein:
said processor further comprises, for each logic block circuit, a test analyzer circuit connected to said test pattern compression circuit, and
each said test analyzer circuit is operable to output test analysis results for a corresponding logic block circuit.

12. A processor as set forth in claim 11, wherein:
said test analyzer circuit comprises:
a first storing circuit operable to store a signature that constitutes results of compression by said test pattern compression circuit;
a second storing circuit operable to store expected value data for said signature; and
a comparator circuit operable to output test analysis results for given logic block circuits by comparing said signature and expected value data for said signature.

13. A processor as set forth in claim 8 wherein:
said processor comprises, for each said logic block circuit, an I/O pad connected to an output of the test pattern compression circuit of each said logic block circuit.

14. A processor as set forth in claim 8 wherein:
said processor comprises, for each said logic block circuit, an I/O pad connected to an output of test analyzer circuit of each said logic block circuit.

15. A testing method for a processor comprising a plurality of logic block circuits, said plurality of logic block circuits comprising at least a first processor core circuit and a second processor core circuit, each processor core circuit having a scan chain circuit and being operable independently, and a common block circuit having a scan chain circuit and a cache circuit that is shared by said first processor core circuits and said second processor core circuits, said processor further comprising, for each said logic block circuit, a test pattern generating circuit operable to generate a test pattern and input the test pattern to the scan chain of each said logic block circuit, and a plurality of test pattern compression circuits operable to accept as input and compress a test pattern output by the scan chain of each said logic block circuit, the testing method comprising:
generating a test pattern with each said test pattern generating circuit;
inputting said generated test patterns from each said test pattern generating circuit into all of the scan chains of each said logic block circuit; and
inputting the test patterns output by the scan chains of each said logic block circuit into said test pattern compression circuits and compressing the input test patterns, wherein said each test pattern compression circuit respectively connected to corresponding said logic block circuit.

16. A processor testing method as set forth in claim 15 wherein:
said processor comprises a TAP controller circuit;
said pattern generating circuit comprises a shift register circuit; and
the test patterns are generated by:
said TAP controller circuit setting an initial value in said shift register circuit; and
applying a shift clock outputted by said TAP controller, causing said test pattern to be generated in said shift register circuit.

17. A processor testing method as set forth in claim 15 wherein:
said processor comprises a TAP controller circuit and said pattern compression circuit comprises a shift register circuit; and
the test patterns are compressed by:
accepting the test pattern outputted by the scan chains of each said logic block circuit as input and applying a shift clock by said TAP controller circuit, causing said test pattern to be compressed in said shift register circuit.

18. A processor testing method as set forth in claim 15, wherein:
said processor comprises a test analyzer circuit connected to said test pattern compression circuit for each said logic block circuit; and
said processor testing method further comprises: after compressing the test patterns, outputting from said test analyzer circuit the test analysis results for the respective logic block circuit.

19. A processor testing method as set forth in claim 18 wherein:
said processor comprises, for each said logic block circuit, an I/O pad which connects the output of the test analyzer circuit provided for each said logic block circuit; and after the test analysis results for said logic block circuit are outputted, outputting the test analysis result for the given logic block circuit, which is the output of said test analyzer circuit, through said I/O pad.

20. A processor testing method as set forth in claim 18 wherein:

said test analyzer circuit comprises:

a first storing circuit which stores the signature that constitutes the results of compression by said test pattern compression circuit;

a second storing circuit which stores the expected value data for said signature; and a comparator circuit which outputs the test analysis results for the given logic block circuit by comparing said signature and the expect value data for said signature; and wherein the test analysis results for the logic block circuit are outputted by:

storing said signature in said first storing circuit;

storing the expected value data for said signature in said second storing circuit; and comparing in said comparator circuit said signature to the expected value data for said signature.

21. A processor testing method as set forth in claim 20 wherein:

said processor comprises, for each said logic block circuit, an I/O pad which connects the output of the test analyzer circuit provided for each said logic block circuit; and after the test analysis results for said logic block circuit are outputted, outputting the test analysis result for the given logic block circuit, which is the output of said test analyzer circuit, through said I/O pad.

22. A processor testing method as set forth in claim 15 wherein:

said processor comprises, for each said logic block circuit, an I/O pad which connects the output of the test pattern compression circuit provided for each said logic block circuit; and after said step wherein the test patterns are compressed, said testing method comprises:

outputting the signature constituting the compression results of said test pattern compression circuit through said I/O pad.

23. A testing method for a processor comprising a plurality of logic block circuits, said plurality of logic block circuits comprising at least a first through nth processor core circuits, each processor core circuit having a scan chain circuit and being operable independently, and a common block circuit having a scan chain circuit and a cache circuit that is shared by said first through nth processor core circuits, said processor further comprising, for each said logic block circuit, a test pattern generating circuit operable to generate a test pattern and input the test pattern to all of said logic block circuits and a plurality of test pattern compression circuits operable to accept as input and compress a test pattern output by the scan chain of each said logic block circuit, the testing method comprising:

generating a test pattern with each said test pattern generating circuit;

inputting said generated test patterns from each said test pattern generating circuit into the scan chains of each said logic block circuit; and inputting the test patterns output by the scan chains of each said logic block circuit into said test pattern compression circuits and compressing the input test patterns, wherein said each test pattern compression circuit respectively connected to corresponding said logic block circuit.

24. A processor testing method as set forth in claim 23 wherein:

said processor comprises a TAP controller circuit;

said pattern generating circuit comprises a shift register circuit; and the test patterns are generated by:

said TAP controller circuit setting an initial value in said shift register circuit; and applying a shift clock outputted by said TAP controller, causing said test pattern to be generated in said shift register circuit.

25. A processor testing method as set forth in claim 23 wherein:

said processor comprises a TAP controller circuit and said pattern compression circuit comprises a shift register circuit; and the test patterns are compressed by:

accepting the test pattern outputted by the scan chains of each said logic block circuit as input and applying a shift clock by said TAP controller circuit, causing said test pattern to be compressed in said shift register circuit.

26. A processor testing method as set forth in claim 23, wherein:

said processor comprises a test analyzer circuit connected to said test pattern compression circuit for each said logic block circuit; and said processor testing method further comprises: after compressing the test patterns, outputting from said test analyzer circuit the test analysis results for the respective logic block circuit.

27. A processor testing method as set forth in claim 26 wherein:

said processor comprises, for each said logic block circuit, an I/O pad which connects the output of the test analyzer circuit provided for each said logic block circuit; and after the test analysis results for said logic block circuit are outputted, outputting the test analysis result for the given logic block circuit, which is the output of said test analyzer circuit, through said I/O pad.

28. A processor testing method as set forth in claim 26 wherein:

said test analyzer circuit comprises:

a first storing circuit which stores the signature that constitutes the results of compression by said test pattern compression circuit;

a second storing circuit which stores the expected value data for said signature; and a comparator circuit which outputs the test analysis results for the given logic block circuit by comparing said signature and the expect value data for said signature; and wherein the test analysis results for the logic block circuit are outputted by:

storing said signature in said first storing circuit;

storing the expected value data for said signature in said second storing circuit; and comparing in said comparator circuit said signature to the expected value data for said signature.

29. A processor testing method as set forth in claim 28 wherein:

said processor comprises, for each said logic block circuit, an I/O pad which connects the output of the test analyzer circuit provided for each said logic block circuit; and after the test analysis results for said logic block circuit are outputted, outputting the test analysis result for the given logic block circuit, which is the output of said test analyzer circuit, through said I/O pad.

30. A processor testing method as set forth in claim 23 wherein:

said processor comprises, for each said logic block circuit, an I/O pad which connects the output of the test pattern compression circuit provided for each said logic block circuit; and after said step wherein the test patterns are compressed, said testing method comprises:

outputting the signature constituting the compression results of said test pattern compression circuit through said I/O pad.

* * * * *